United States Patent
Cok et al.

(10) Patent No.: US 9,676,640 B2
(45) Date of Patent: Jun. 13, 2017

(54) MAKING MICRO-CHANNEL ELECTRODE STRUCTURE

(71) Applicant: Eastman Kodak Company, Rochester, NY (US)

(72) Inventors: Ronald Steven Cok, Rochester, NY (US); Mitchell Stewart Burberry, Webster, NY (US)

(73) Assignee: EASTMAN KODAK COMPANY, Rochester, NY (US)

(*) Notice: Subject to any disclaimer, the term of this patent is extended or adjusted under 35 U.S.C. 154(b) by 236 days.

(21) Appl. No.: 14/695,130

(22) Filed: Apr. 24, 2015

(65) Prior Publication Data

US 2016/0313640 A1    Oct. 27, 2016

(51) Int. Cl.
*G03F 7/00* (2006.01)
*C02F 1/46* (2006.01)

(52) U.S. Cl.
CPC .......... *C02F 1/4604* (2013.01); *G03F 7/0002* (2013.01)

(58) Field of Classification Search
CPC . G03F 7/0002; G03F 7/10; G03F 7/00; G03F 7/20; G03F 7/32; C02F 1/4604; C02F 1/46; H01M 4/04; H01M 4/0407; H01M 4/0414; H01M 4/0416; H01M 4/0433; H01M 4/0473; H01M 4/8853; H01M 4/8857
See application file for complete search history.

(56) References Cited

U.S. PATENT DOCUMENTS

2008/0057274 A1* 3/2008 Hagiwara ......... B01L 3/502738
                                                                428/172
2014/0183046 A1    7/2014 Crooks et al.

OTHER PUBLICATIONS

Knust et al, Electrochemically Mediated Seawater Desalination, (Angewante Chemie Int. ED 2013, 52, 8107-8110).
(Continued)

*Primary Examiner* — Mark F Huff
*Assistant Examiner* — Monique Wills
(74) *Attorney, Agent, or Firm* — Raymond L. Owens

(57) ABSTRACT

A method of making a micro-channel electrode structure includes providing a curable layer and imprinting the curable layer to form an electrode micro-channel and a fluid micro-channel in a common step. The electrode micro-channel intersects the fluid micro-channel to form a micro-channel intersection. The curable layer is cured to form an imprinted cured layer. Both the electrode and the fluid micro-channels are filled with a developable material that is exposed with an electrode pattern including the electrode micro-channel and extending from the electrode micro-channel into the micro-channel intersection without occluding the fluid micro-channel. The exposed developable material is developed to remove the developable material from the electrode pattern and the electrode micro-channel and the micro-channel intersection corresponding to the electrode pattern are at least partly filled with a conductive material. At least a portion of the remaining developable material is removed from the fluid micro-channel.

18 Claims, 27 Drawing Sheets

(56) References Cited

OTHER PUBLICATIONS

Foley et al, Direct Desalination of Seawater with Nanofluidic PDMS Chips (published on NICE DB https://nice.asu.edu 2014).
Kim et al, A portable and high energy efficient desalination/purification system by ion concentration polarization, Proc. of SPIE vol. 8548, 85483R 2012.
Yang et al, Carbon nanotube membrades with ultrahigh specific adsorption capacity for water desalination and purification, (Nature Communications 4, 2220, 2013).

* cited by examiner

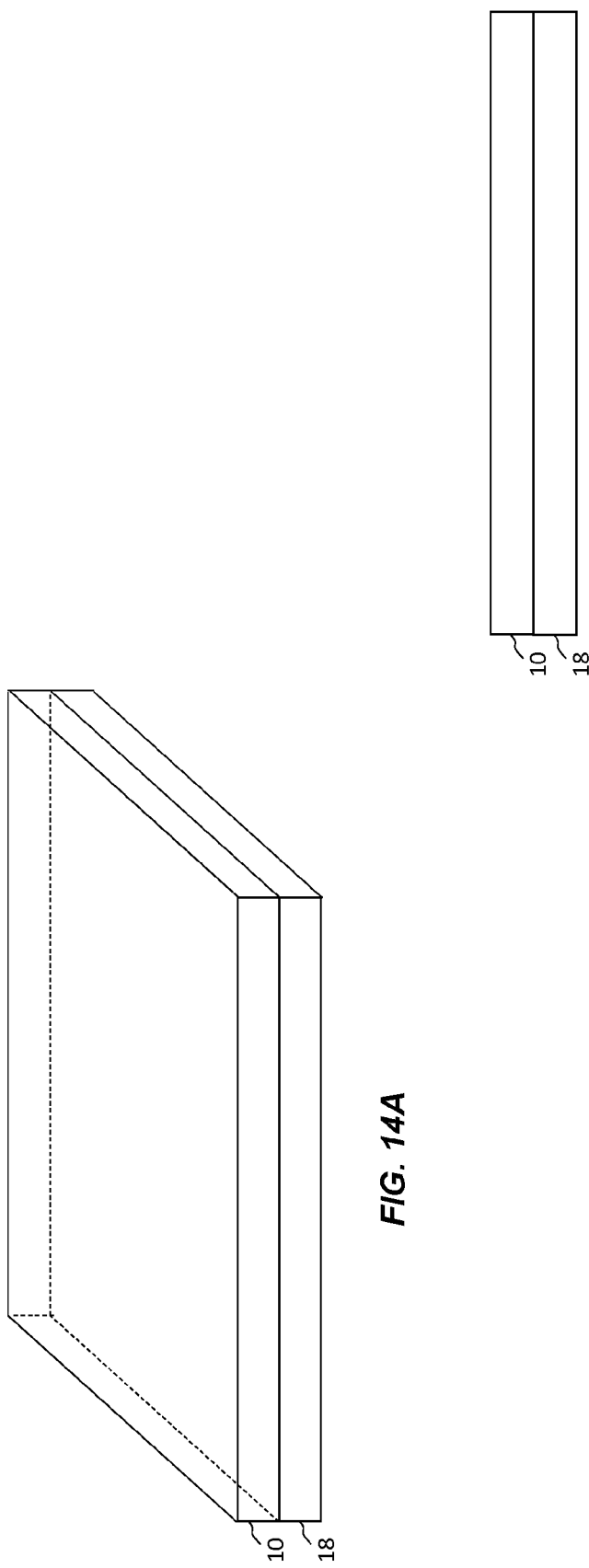

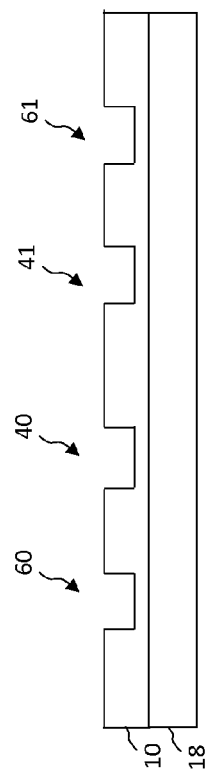
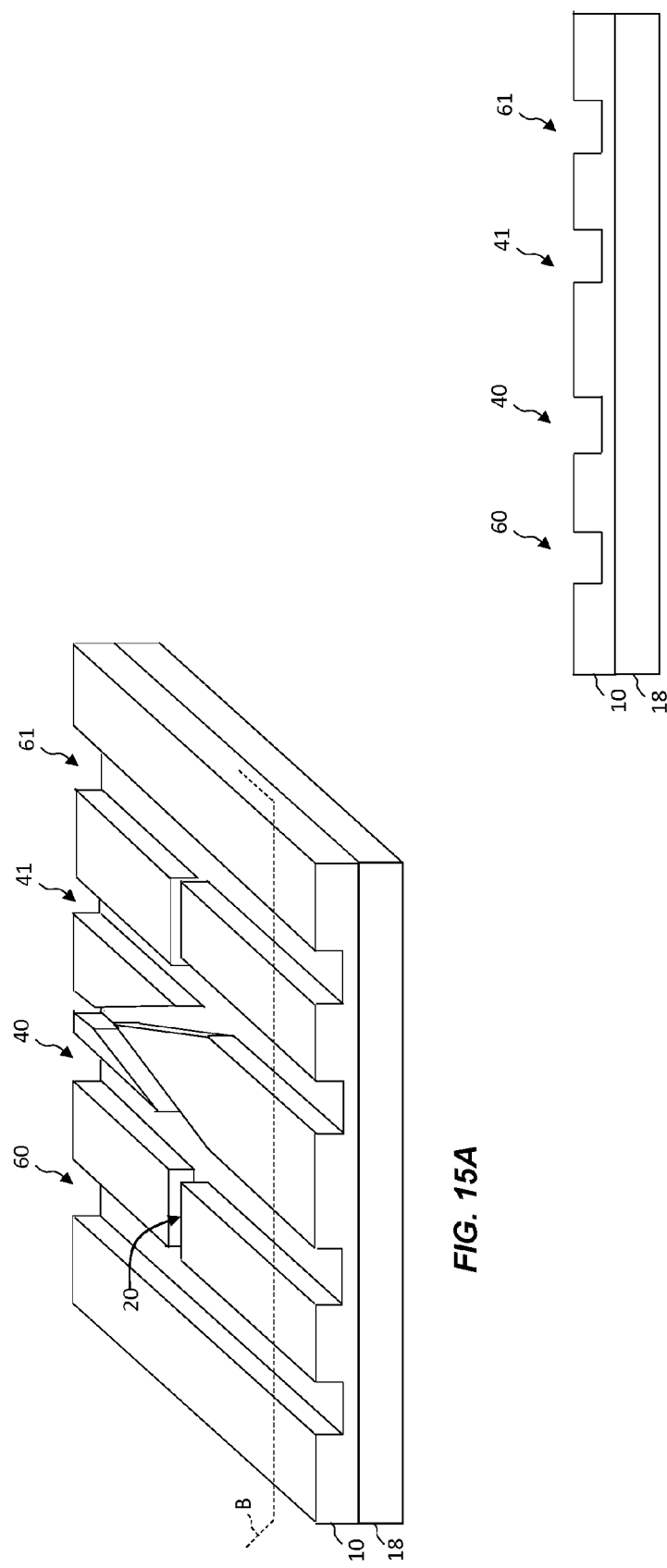
FIG. 15A
FIG. 15B

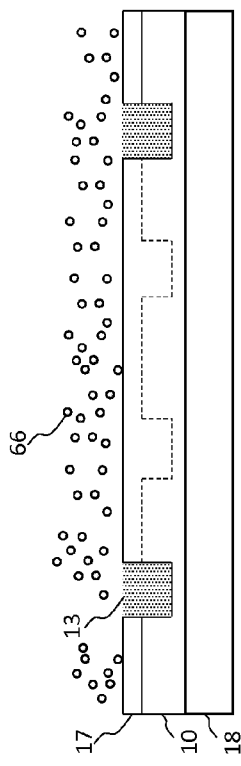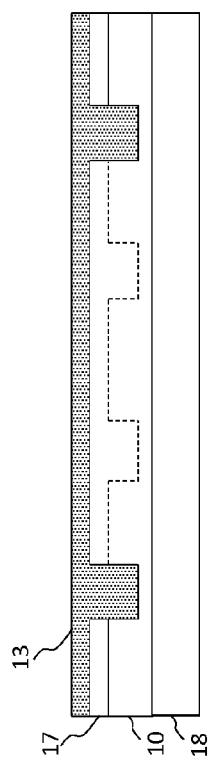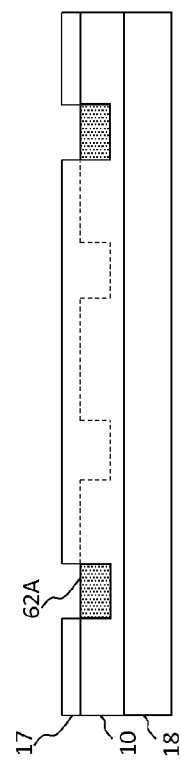

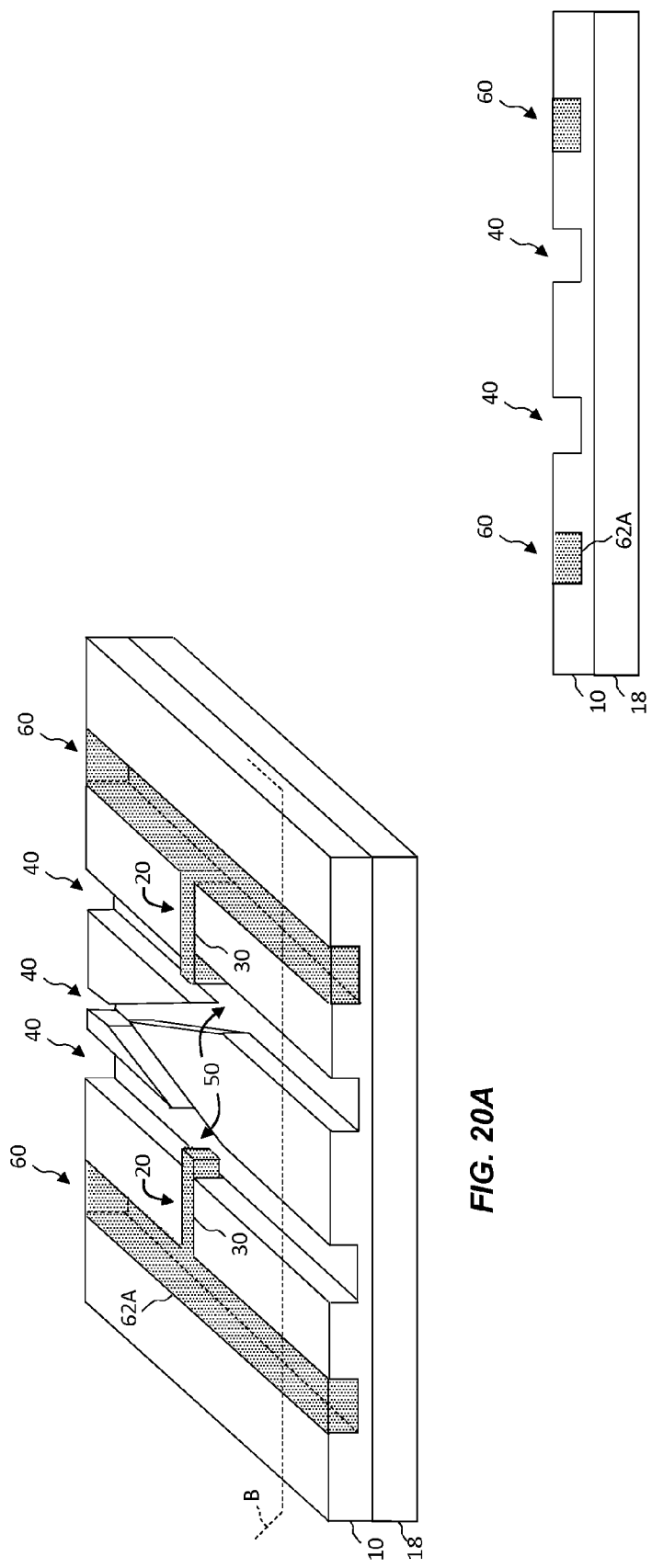

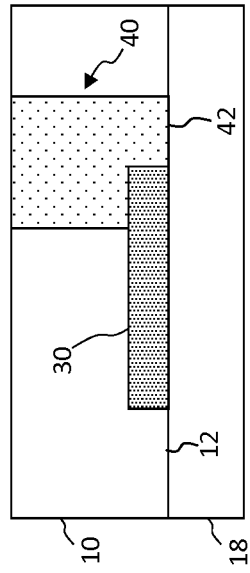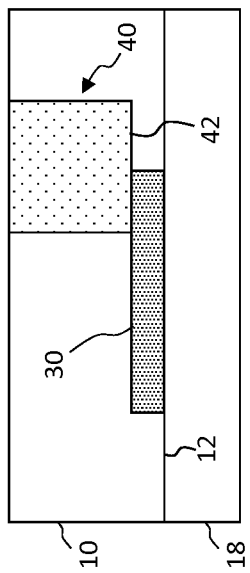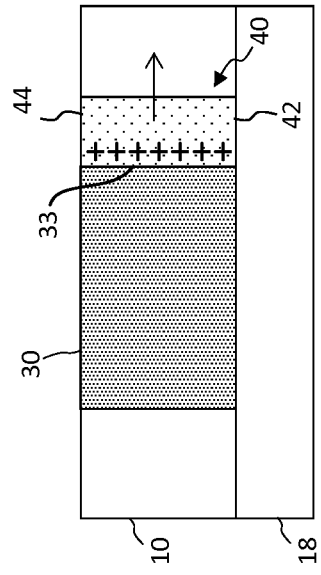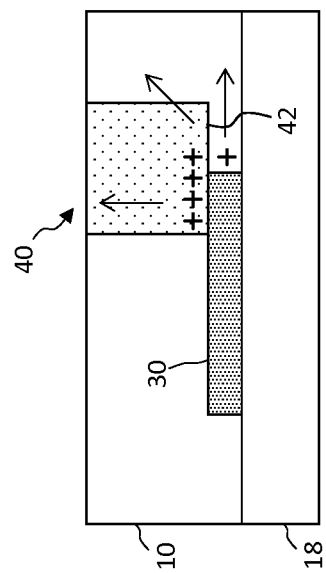

MAKING MICRO-CHANNEL ELECTRODE STRUCTURE

CROSS REFERENCE TO RELATED APPLICATIONS

Reference is made to commonly-assigned U.S. patent application Ser. No. 14/695,097 (now U.S. Publication No. 2016/0311707), filed Apr. 24, 2015, entitled Micro-Channel Electrode Structure, by Cok et al, to commonly-assigned U.S. patent application Ser. No. 14/695,148 (now U.S. Publication No. 2016/0311704), filed Apr. 24, 2015, entitled Conductive Micro-Channel Structure, by Cok et al, to commonly-assigned U.S. patent application Ser. No. 14/695,160 (now U.S. Publication No. 2016/0311705), filed Apr. 24, 2015, entitled Three-Dimensional Micro-Channel Structure, by Cok et al, the disclosures of which are incorporated herein.

FIELD OF THE INVENTION

The present invention relates to three-dimensional micro-channel structures enabling electrochemical reactions between an electrode and a flowing fluid.

BACKGROUND OF THE INVENTION

Electrochemical reactions between an electrolyte (an ionic conductor) and an electrode are of widespread interest. Electrochemical reactions occur when an externally provided current passes between the electrode and the electrolyte. Electrolytes are commonly found, for example, in batteries and are of great interest for new forms of energy storage.

Recent research has also demonstrated that electrochemical reactions are useful in water desalination. For example, in Electrochemically Mediated Seawater Desalination (Angewandte Chemie Int. Ed. 2013, 52, 8107-8110) the authors describe a branched micro-channel where a bipolar electrode is present. When the bipolar electrode is connected to a power source providing a voltage and seawater passes through the micro-channel, brine is separated from desalted water. U.S. Patent Application Publication No. 20140183046 describes similar structures. The article Direct Desalination of Seawater with Nanofluidic PDMS Chips Mediated Seawater Desalination (published at https://nice.asu.edu/nano/direct-desalination-seawater-nanofluidic-pdms-chips), discloses a similar branched micro-fluidic structure. A related article in the Proc. of SPIE Vol. 8548 85483R-6 entitled A portable and high energy efficient desalination/purification system by ion concentration polarization describes a higher-throughput water desalination approach that utilizes ion concentration polarization. Ultra-long carbon nanotubes have also exhibited ultrahigh specific adsorption capacity for salt, as described in the article Carbon nanotube membranes with ultrahigh specific adsorption capacity for water desalination and purification published in Nature Communications 4, Article number: 2220 doi:10.1038/ncomms3220.

There remains an on-going need for inexpensive, efficient, low-energy, high-throughput methods and devices for enabling electrochemical reactions between an electrolyte and an electrode.

SUMMARY OF THE INVENTION

In accordance with the present invention, a method of making a micro-channel electrode structure comprises:

a) providing a curable layer;
b) imprinting the curable layer to form an electrode micro-channel and a fluid micro-channel in a common step, the electrode micro-channel intersecting the fluid micro-channel to form a micro-channel intersection, and curing the curable layer to form an imprinted cured layer;
c) at least partially filling both the electrode micro-channel and the fluid micro-channel with a developable material;
d) exposing the developable material with an electrode pattern, the electrode pattern including the electrode micro-channel and extending from the electrode micro-channel into the micro-channel intersection without occluding the fluid micro-channel;
e) developing the exposed developable material to remove the developable material from the electrode pattern;
f) at least partially filling the electrode micro-channel and the micro-channel intersection corresponding to the electrode pattern with a conductive material; and
g) removing at least a portion of the remaining developable material from the fluid micro-channel.

The present invention provides structures, devices, and methods for electrochemical reactions between a liquid electrolyte and an electrode that have an increased flow rate for the liquid electrolyte, improved energy efficiency, and a reduced manufacturing cost.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 14A-14B are perspective and cross section views of a curable layer imprinted on the support structure according to an embodiment of the present invention;

FIGS. 15A-15B are perspective and cross section views of the structure of FIGS. 14A-14B with an imprinted micro-channel according to an embodiment of the present invention;

FIGS. 19C-19E show sequential steps useful for applying the conductive material shown in FIGS. 19A-19B;

FIGS. 20A-20B are perspective and cross section views of micro-channel structures according to an embodiment of the present invention;

FIGS. 21A and 21B illustrate electrode structures useful in understanding embodiments of the present invention;

FIGS. 22A and 22B illustrate charge patterns useful in understanding embodiments of the present invention.

The Figures are not drawn to scale since the variation in size of various elements in the Figures is too great to permit depiction to scale.

DETAILED DESCRIPTION OF THE INVENTION

The present invention provides a three-dimensional micro-channel structure with reduced resistance electrodes and higher-volume micro-channels that is made in a cost-efficient and scalable process.

Figure 1:
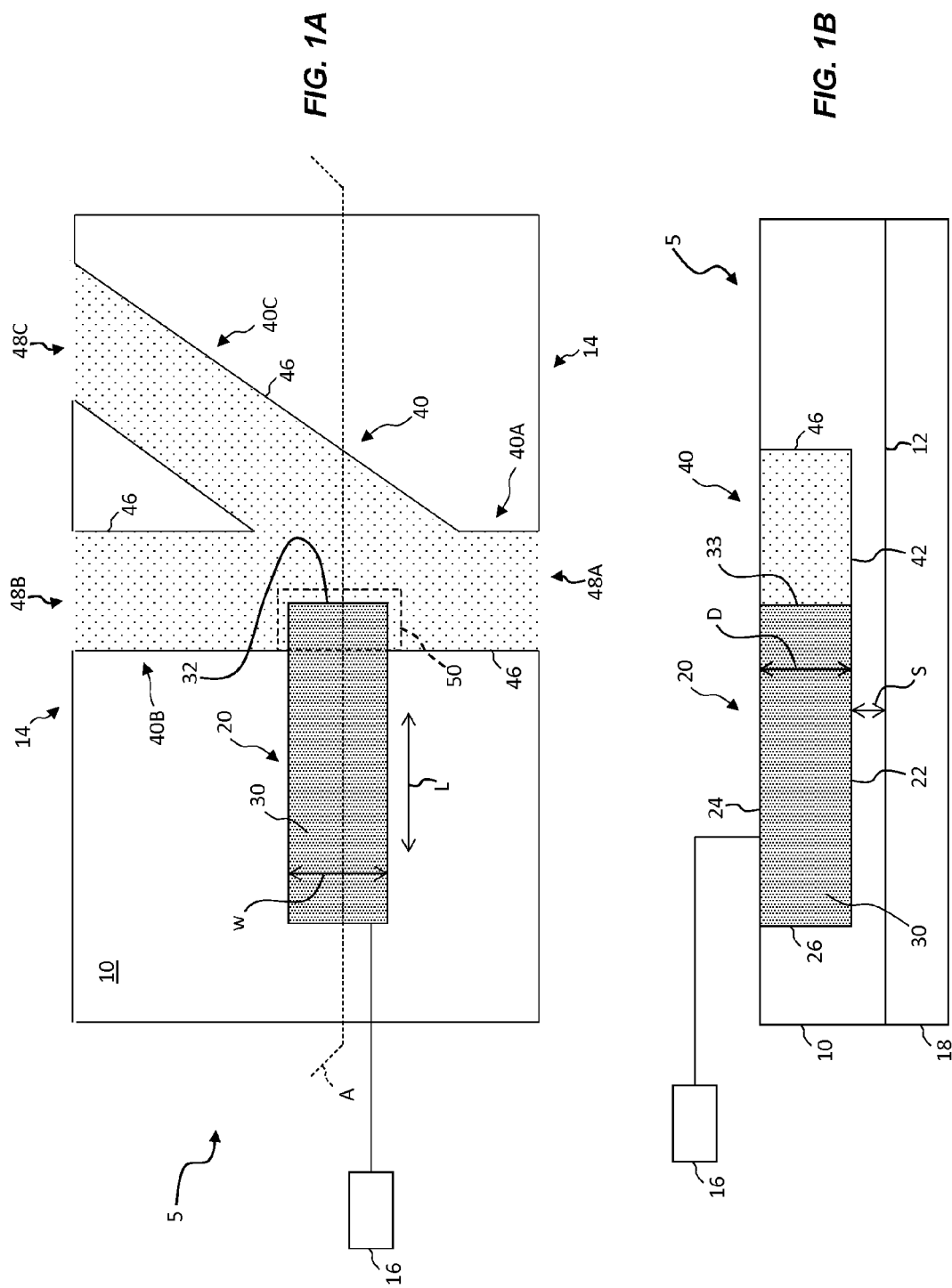
FIG. 1A is a plan view illustrating an embodiment of the present invention.
FIG. 1B is a cross section illustrating the embodiment of FIG. 1A taken along cross section line A.

Referring to FIG. 1A in a top view and to FIG. 1B in a cross section corresponding to cross section line A of FIG. 1A, in an embodiment of the present invention, a micro-channel electrode structure 5 includes a layer 10. An electrode micro-channel 20 is formed in the layer 10. The electrode micro-channel 20 has an electrode micro-channel bottom 22 forming the bottom of the electrode micro-channel 20, an electrode micro-channel top 24 forming the top of the electrode micro-channel 22, and an electrode micro-channel wall 26 defining a side of the electrode micro-channel 20. The electrode micro-channel 20 is at least partially filled with an electrically conductive electrode 30 that extends along the electrode micro-channel 20, for example in the length direction L of the electrode micro-channel 20, and extends from the electrode micro-channel bottom 22 toward the electrode micro-channel top 24, for example 20%, 50%, 70%, 90%, 95% or substantially all of the way (>95%) from the electrode micro-channel bottom 22 to the electrode micro-channel top 24. The electrode 30 can be irregularly shaped and can fill the electrode micro-channel 20 to differing extents at different locations in the electrode micro-channel 20.

A fluid micro-channel 40 adapted to carry, convey, or transport a fluid through the fluid micro-channel 40 is also formed in the layer 10 and includes a fluid micro-channel bottom 42 forming the bottom of the fluid micro-channel 40 and a fluid micro-channel wall 46 defining or forming a side of the fluid micro-channel 40. In an embodiment, the fluid micro-channel 40 is a micro-fluidic micro-channel having a width or depth less than 1 mm, 100 microns, or 50 microns and is adapted to receive or expel a flow of liquid or fluid. In an embodiment, the layer 10 is formed or located on a support 18. An electrical power source 16 is electrically connected to the electrode 30. The fluid micro-channel 40 intersects the electrode micro-channel 20 in the layer 10 to form a micro-channel intersection 50. The electrode 30 extends from the electrode micro-channel 20 into the micro-channel intersection 50 and the fluid micro-channel 40 without occluding the fluid micro-channel 40.

The support 18 can include rigid materials, for example glass, metals, thick plastic, or flexible materials for example thin plastic layers such as PET or thin glass layers and can provide smooth surfaces on which other layers (such as the layer 10) are located. The support 18 can include or be adhesive layers or release layers. The layer 10 can be a plastic, polymer, or resin, for example a cured resin including cross-linking materials in a cross-linked polymer. Such materials and layers are known in the art. In various embodiments, the electrode 30 is or includes a metal or other conductive material. In other aspects, the electrode 30 is solid or includes a porous or partially porous plurality of sintered electrically conductive particles or particles coated with an electrically conductive shell such as are known in the art. In an aspect of the invention, the electrode 30 is a cured conductive ink. The electrical power source 16 provides a voltage differential between the electrode 30 and a fluid that flows through the fluid micro-channel 40, for example a voltage greater than 0 and less than 5 volts, less than 10 volts, less than 50 volts or less than 100 volts. The electrical power source 16 can provide alternating or direct current. Such power sources are well known and commercially available.

In an embodiment of the present invention illustrated in FIG. 1B, the layer 10 has a layer bottom 12. The fluid micro-channel bottom 42 and the electrode micro-channel bottom 22 are substantially the same distance S from the layer bottom 12. Thus, the fluid micro-channel 40 has the same depth D as the electrode micro-channel 20 in the layer 10. If the electrode 30 fills the electrode micro-channel 20, the electrode 30 also has a thickness that is the same as the depth D of the electrode micro-channel 20 and the fluid micro-channel 40. In a useful embodiment, the distance S between the layer bottom 10 and the electrode micro-channel bottom 22 or the fluid micro-channel bottom 42 is greater than zero. In an alternative embodiment (not shown) the difference between the distance from the fluid micro-channel bottom 42 to the electrode micro-channel bottom 22 is less than the distance the electrode 30 extends from the electrode micro-channel bottom 22 toward the electrode micro-channel top 24 (the electrode height). In such an embodiment, the electrode micro-channel 20 and the fluid micro-channel 40 have different depths D and this difference is smaller than the electrode height.

As shown in FIG. 1A, the fluid micro-channel 40 includes first, second, and third fluid micro-channel portions 40A, 40B, 40C extending from the micro-channel intersection 50 to form a branched fluid micro-channel 40. The first, second, and third fluid micro-channel portions 40A, 40B, 40C have corresponding first, second, and third fluid ports 48A, 48B, 48C into or out of which fluid flows into or out of the fluid micro-channel 40, respectively, at an edge 14 of the layer 10. A fluid port is simply an opening in the layer 10 through which fluid can flow into or out of the fluid micro-channel 40 and defines an end of the fluid micro-channel 40. According to a useful aspect of the present invention, one of the first, second, or third fluid micro-channel portions 40A, 40B, 40C is an input micro-channel portion into which fluid flows (e.g., the first fluid micro-channel portion 40A) while the remaining two micro-channel portions are micro-channel portions out of which fluid flows (e.g., the second and third fluid micro-channel portions 40B, 40C). The first, second, and third fluid micro-channel portions 40A, 40B, 40C do not have to have a common size, depth, or width, but in a useful embodiment, they have a common depth. In another useful embodiment, the width of the input portion is approximately equal to the sum of the widths of the two output portions so that a volume of the liquid flowing into the input micro-channel portion flows at the same rate out of the two output micro-channel portions without wasting space in the layer 10. Approximately equal can mean within 25%, within 10%, within 5% or within 1%.

Figure 2:
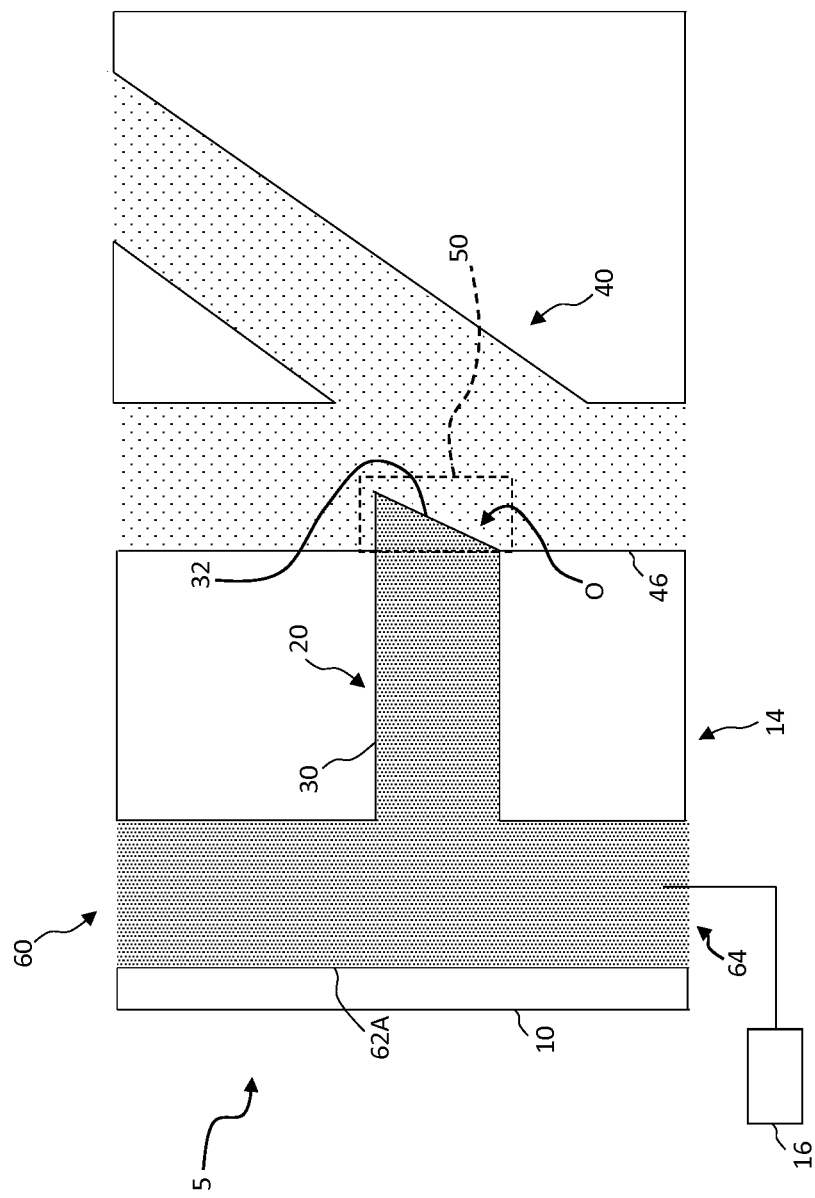
FIG. 2 is a plan view illustrating an alternative embodiment of the present invention.

Referring to FIG. 2, the electrode micro-channel 20 of the micro-channel electrode structure 5 also intersects a conductor micro-channel 60 formed in the layer 10. The conductor micro-channel 60 includes an electrical conductor, for example an electrically conductive solid conductor 62A that can be the same electrical conductor as that which makes up the electrode 30 in the electrode micro-channel 20, such as a metal, a sintered collection of conductive particles, or a cured conductive ink. The solid conductor 62A is electrically connected to the electrical power source 16 through a conductor port 64 and to the electrode 30. The conductor port 64 is simply an opening in the layer 10 through which an electrical connection is made to the solid conductor 62A and thence to the electrode 30. The conductor port 64 defines an end of the conductor micro-channel 60 at an edge 14 of the layer 10. In a further embodiment, the solid conductor 62A can also only partially fill any portion of the first, second, or third fluid micro-channel portions 40A, 40B, 40C to further improve the conductivity of the fluid micro-channel 40 (not shown).

In an embodiment illustrated in FIG. 1A, the electrode 30 has a horizontal electrode edge 32 that extends from the fluid micro-channel wall 46 into the micro-channel intersection 50 at an angle that is perpendicular or parallel to the fluid micro-channel wall 46. Alternatively, in an embodiment illustrated in FIG. 2, the electrode 30 has a horizontal electrode edge 32 that extends from the fluid micro-channel wall 46 into the micro-channel intersection 50 at an oblique angle O that is not perpendicular or parallel to the fluid micro-channel wall 46. Such an oblique horizontal electrode edge 32 can influence the physical flow of liquid into or out of the micro-channel intersection 50 and increase the rate at which liquid flows through the fluid micro-channel 40 and the effectiveness of an electrochemical reaction in the micro-channel intersection 50, particularly for the branched fluid micro-channel 40 illustrated in FIG. 2.

Referring to FIG. 1B, in an embodiment of the present invention, the electrode 30 has a vertical electrode edge 33 that extends in the electrode micro-channel 20 from the electrode micro-channel bottom 22 toward the electrode micro-channel top 24 in a direction that is on average substantially parallel (i.e., within manufacturing and materials tolerances) to the fluid micro-channel wall 46. Alternatively, referring to FIG. 3 in another embodiment of the present invention, the electrode 30 of the micro-channel electrode structure 5 has a vertical electrode edge 33 that extends from the electrode micro-channel bottom 22 toward the electrode micro-channel top 24 for the depth D in a direction that is on average not parallel to the fluid micro-channel wall 46 in the layer 10. As with the oblique horizontal electrode edge 32 of FIG. 2, the non-parallel vertical electrode edge 33 can influence the physical flow of liquid into or out of the micro-channel intersection 50 and increase the rate at which liquid flows through the fluid micro-channel 40 and the effectiveness of an electrochemical reaction in the micro-channel intersection 50, particularly for the branched fluid micro-channel 40 illustrated in FIG. 2.

Figure 3:
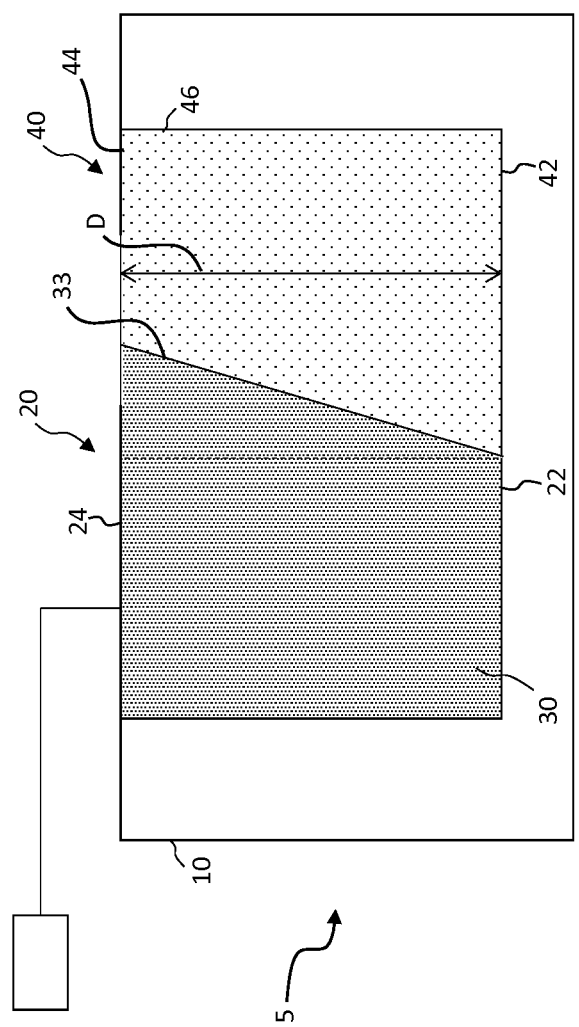
FIG. 3 is a cross section illustrating yet another embodiment of the present invention.

In a further embodiment of the present invention shown in FIG. 3, the electrode micro-channel 20 has a depth D and a width W (FIG. 1A) and the depth D is greater than the width W. Such an arrangement enables a greater quantity of liquid in the fluid micro-channel 40 to flow past the electrode 30 at a closer distance, especially if the vertical electrode edge 33 extends substantially from the fluid micro-channel bottom 42 to a fluid micro-channel top 44. In a useful embodiment, the electrode micro-channel depth D is at least two times or at least four times greater than the electrode micro-channel width W.

Figure 4:
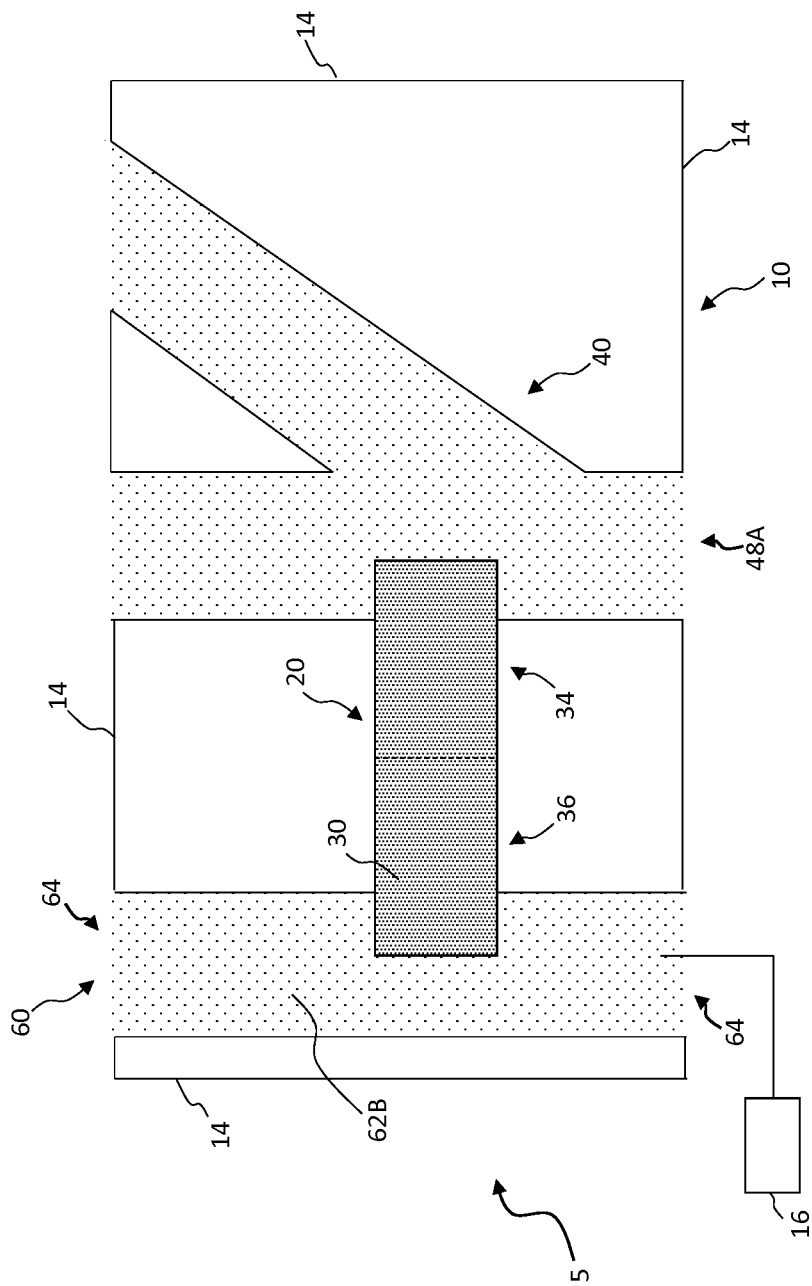
FIG. 4 is a plan view illustrating another embodiment of the present invention.

Referring next to FIG. 4, the electrode 30 in the electrode micro-channel 20 has first and second electrode portions terminating in first and second electrode ends 34, 36. The fluid micro-channel 40 intersects the first electrode end 34 in the electrode micro-channel 20. The conductor micro-channel 60 intersects the second electrode end 36. In an embodiment, the conductor micro-channel 60 includes an electrically conductive fluid conductor 62B electrically connected to the electrical power source 16 and the electrode 30 rather than the electrically conductive solid conductor 62A (FIG. 2). The fluid conductor 62B can include the same fluid as that which flows into the fluid micro-channel 40. In such an arrangement, conductor micro-channel 60 can have two conductor ports 64, each at an edge 14 of the layer 10. One conductor port 64 into which fluid flows and the other conductor port 64 out of which fluid flows so that conductive liquid flows through the conductor micro-channel 60 as it does through the fluid micro-channel 40 (although it is not subjected to an electrochemical process). Alternatively, the conductor micro-channel 60 is charged with an electrically conductive fluid that stays in place while the micro-channel electrode structure 5 is in use. In general, the various embodiments and structures of the present invention can use either the solid conductor 62A or the fluid conductor 62B in the conductor micro-channel 60.

Thus, in an embodiment, the conductive micro-channel structure includes the layer 10 having the layer edges 14, the electrode 30 having the first and second electrode ends 34, 36 formed in or under the layer 10, one or more fluid micro-channels 40 formed in the layer 10 and exposing the first electrode end 34 of the electrode 30, the fluid micro-channel 40 extending to the layer edge 14 to form a fluid port, e.g. first fluid port 48A, and the conductor micro-channel 60 including the solid electrical conductor 62A (FIG. 2) in the conductor micro-channel 60, the solid conductor 62A electrically connected to the second electrode end 36 of the electrode 30 and extending from the second electrode end 36 to the layer edge 14 to form the conductor port 64. In this embodiment, the fluid micro-channel 40 and the conductive micro-channel 60 extend to the same layer edge 14.

Figure 5:
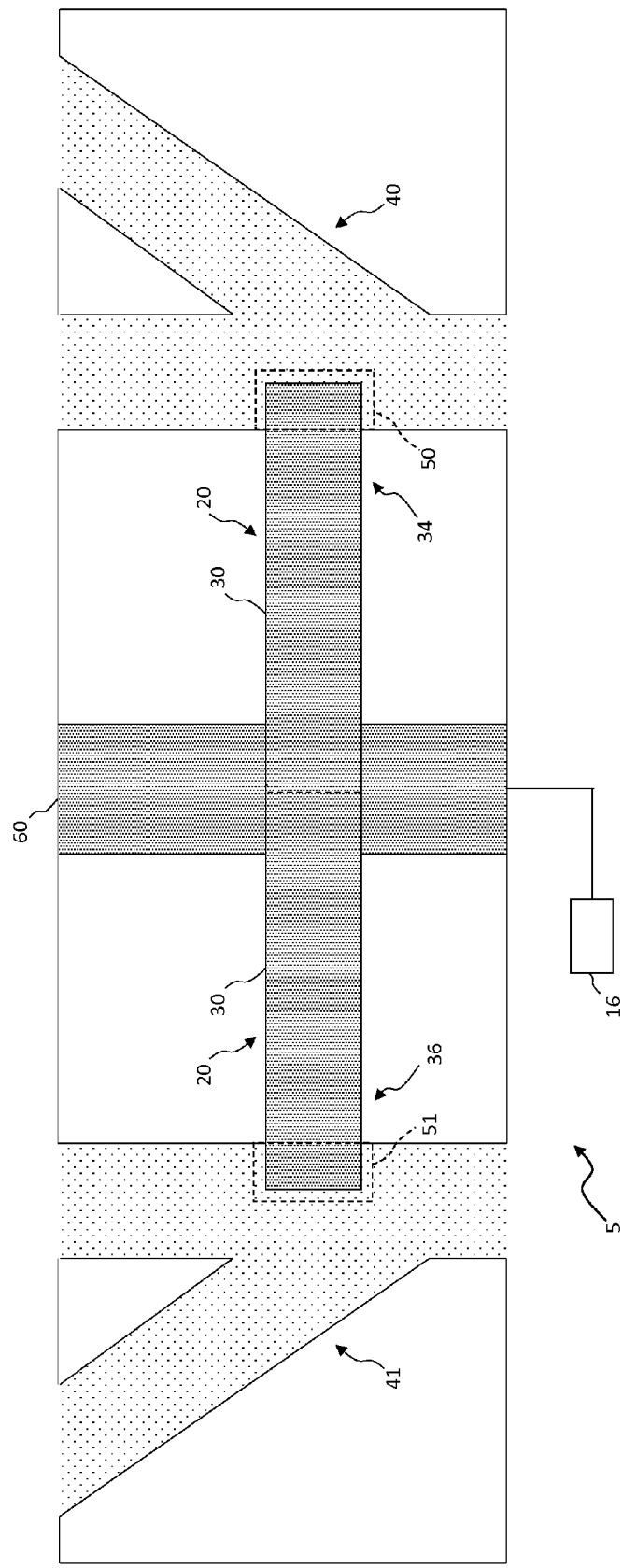
FIGS. 5-6 are plan views illustrating other embodiments of the present invention.

Referring to an embodiment illustrated in FIG. 5, the electrode 30 of the micro-channel electrode structure 5 has first and second electrode portions terminating in first and second electrode ends 34, 36. The branched fluid micro-channel 40 intersects the first electrode end 34 in the electrode micro-channel 20 to form the micro-channel intersection 50. Another branched fluid micro-channel 41 intersects the second electrode end 36 (rather than the conductor micro-channel 60) to form another micro-channel intersection 51. Thus a single conductor micro-channel 60 electrically connected to a single electrical power source 16 provides electrical current or charge to two different fluid micro-channels 40, 41.

Figure 6:
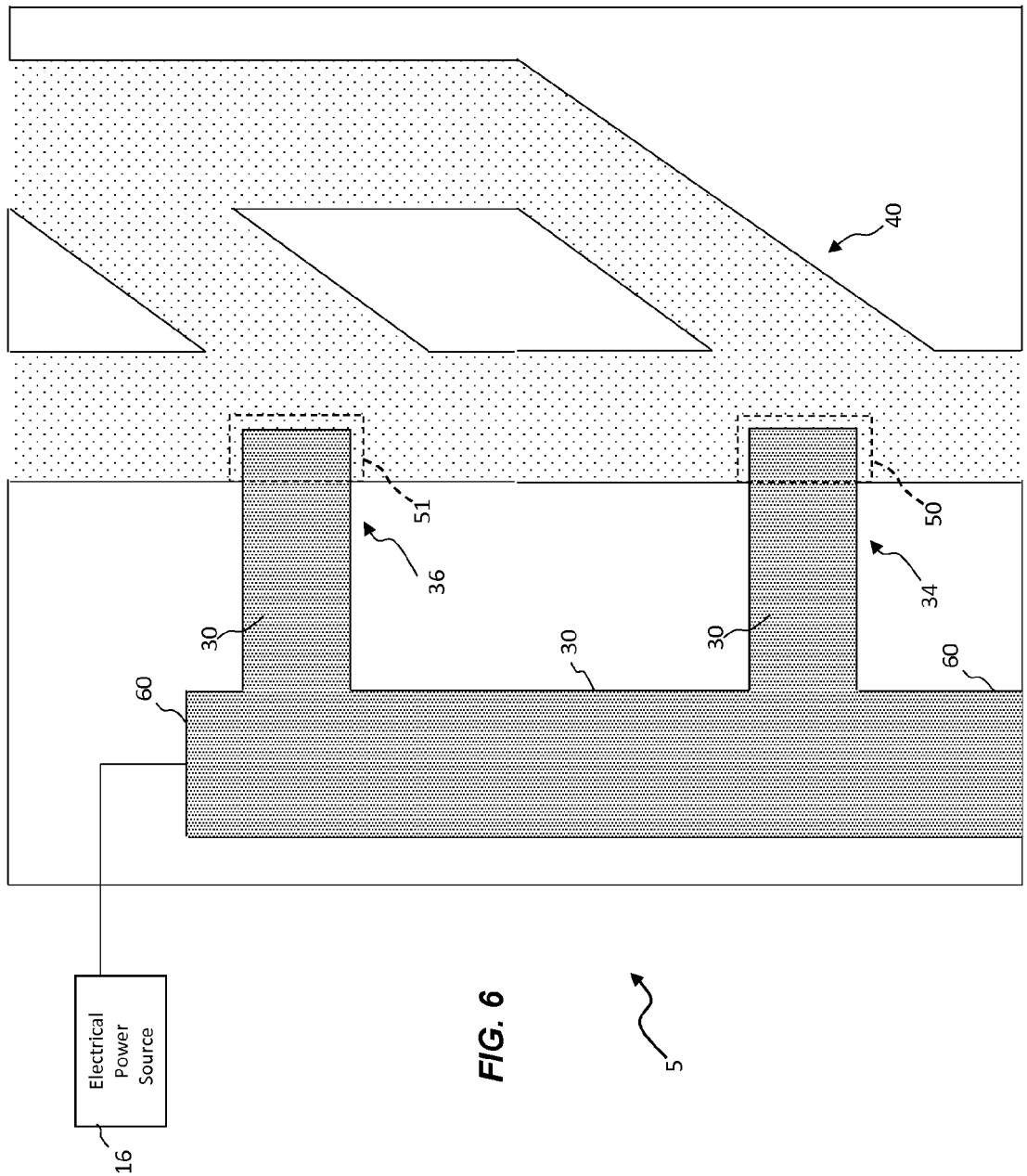

In the micro-channel electrode structure 5 embodiment of FIG. 6, a single fluid micro-channel 40 is exposed to two different first and second electrode ends 34, 36 of electrode 30 in sequence. Branches of each of the fluid micro-channel 40 intersections are combined and can, for example channel fluid to a common output port. Thus, the fluid micro-channel 40 intersects the one electrode end 34 to form the micro-channel intersection 50 and also intersects the other electrode end 36 to form another micro-channel intersection 51. The electrode 30 extends from the electrode micro-channel 20 into the other micro-channel intersection 51 without occluding the fluid micro-channel 40.

Figure 7:
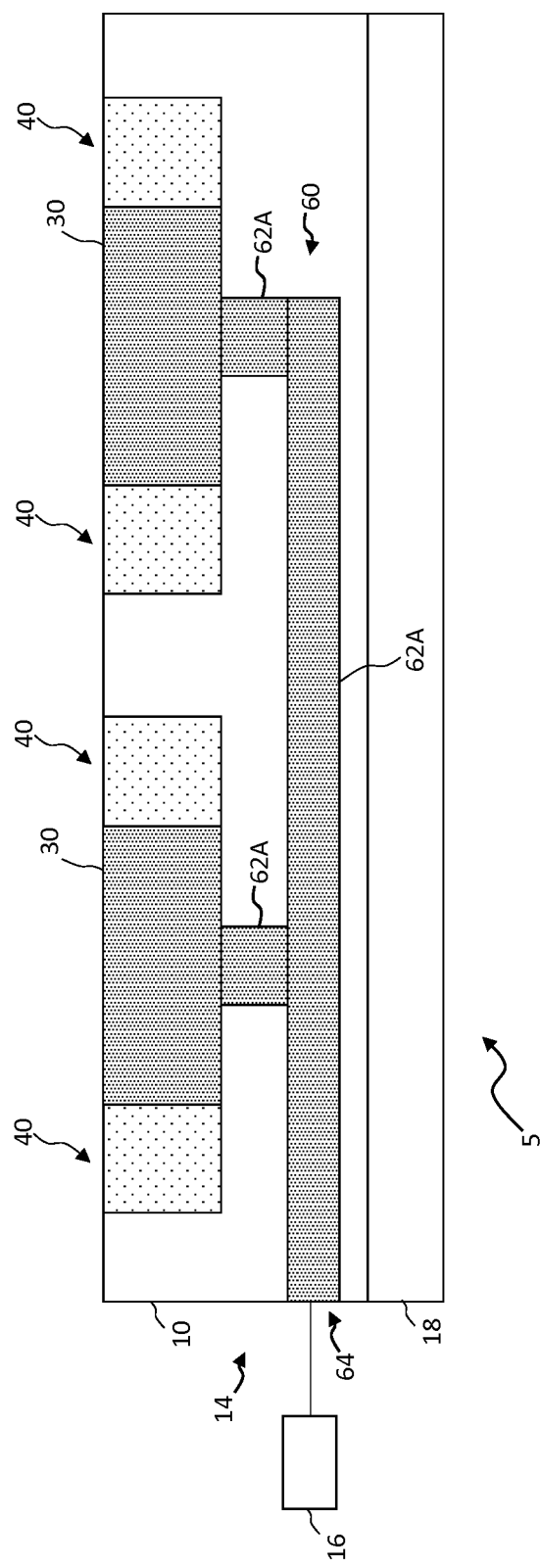
FIG. 7 is a cross section illustrating an embodiment of the present invention.

Referring to FIG. 7, in a further embodiment of the micro-channel electrode structure 5 of FIG. 5, multiple pairs of the fluid micro-channels 40 are formed in the layer 10 on the support 18. Each pair of fluid micro-channels 40 intersects a separate electrode 30 formed in an electrode micro-channel 20. Thus, a plurality of electrodes 30 each have electrode portions with first and second electrode ends 34, 36 formed in or under the layer 10. A corresponding plurality of the fluid micro-channels 40 are formed in the layer 10. Each of the fluid micro-channels 40 exposes the electrode portion having the first electrode end 34 of the electrode 30 and a plurality of conductor micro-channels 60. The conductor micro-channels 60 each include a solid conductor 62A that is electrically connected to the electrode portion having the second electrode end 36 of the electrodes 30 and extends from the second electrode end 36 to an edge 14 of the layer 10, for example through a conductor port 64. The solid conductor 62A is electrically connected to the electrical power source 16.

The electrodes 30 are electrically connected in common to the solid conductors 62A formed beneath the electrode 30 and the fluid micro-channels 40 so that one conductor micro-channel 60 is electrically connected to the electrode portion having the second electrode end 36 of two or more electrodes 30. Thus, in this embodiment the solid conductor 62A passes under the fluid micro-channel 40 or under the electrode 30. The solid conductors 62A are electrically accessible through the conductor port 64. Thus, multiple electrodes 30 are electrically connected to a common solid conductor 62A and electrically accessible through a single conductor port 64 so that a single electrical power source 16 is connected to a plurality of electrodes 30 through a single electrical connection. In this embodiment, the conductor port 64 is on a different side of the layer 10 than the fluid ports so that the fluid micro-channel 40 extends to a different edge 14 of the layer 10 than the conductor micro-channel 60. This connection structure is applicable to any of the electrode 30 and fluid micro-channel 40 arrangements disclosed herein.

Figure 8:
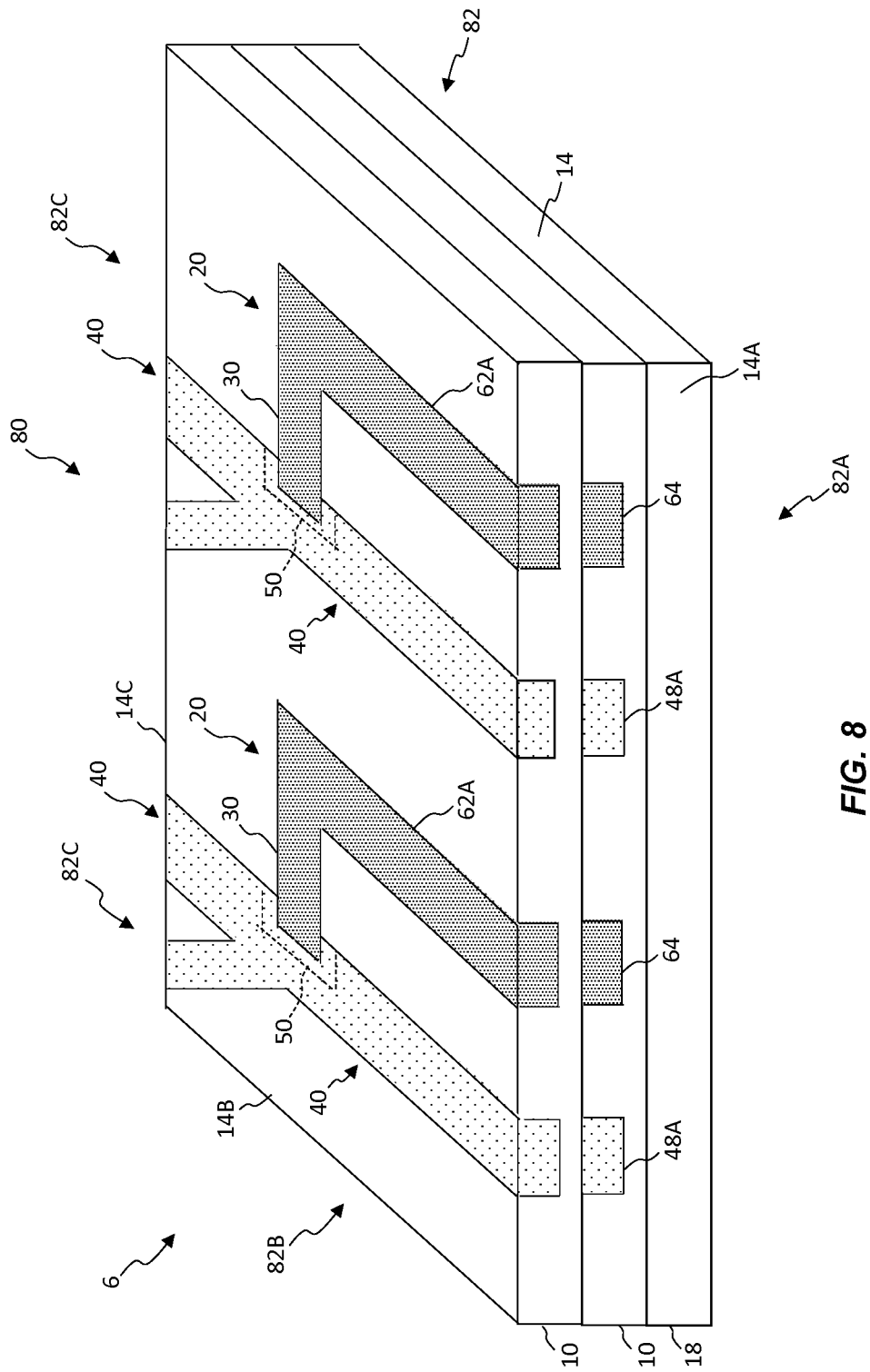
FIG. 8 is a perspective illustrating an embodiment of the present invention.

In an embodiment of the present invention, FIG. 8 illustrates a three-dimensional micro-channel structure 6. As shown in the perspective of FIG. 8, a plurality of layers 10 are provided on a support 18 or in a free-standing stack forming a solid structure 80 having multiple faces: front face 82A, side face 82B, and back face 82C. Each face 82 corresponds to a common edge 14 of the layers 10; the front face 82A corresponds to the input layer edge 14A, the side face 82B corresponds to the conductor layer edge 14B, and the back face 82C corresponds to the output layer edge 14C. It will be appreciated that the designation of front, side, and back are dependent on orientation and can be interchanged simply by rotating the solid structure 80. The invention is not limited in any way by these relative designations; the face, edge, and back labels are selected simply to clarify the discussion and can be interchanged.

Referring also to FIG. 1B, each layer 10 includes one or more electrode micro-channels 20 formed in the layer 10, each electrode micro-channel 20 having an electrode micro-channel bottom 22 forming the bottom of the electrode micro-channel 20 and the electrode micro-channel top 24 forming the top of the electrode micro-channel 20. The electrode micro-channel 20 is at least partially filled with the electrode 30 extending along the electrode micro-channel 20 and extends from the electrode micro-channel bottom 22 toward the electrode micro-channel top 24. One or more fluid micro-channels 40 are formed in the layer 10, each fluid micro-channel 40 adapted to carry, convey, or transport a fluid. Each fluid micro-channel 40 intersects the electrode micro-channel 20 in the layer 10 to form a micro-channel intersection 50. The electrode 30 extends from the electrode micro-channel 20 into the micro-channel intersection 50 without occluding the fluid micro-channel 40.

Each fluid and electrode micro-channel 40, 20 extends to an edge 14 of the layer 10. The edges 14 can correspond to the faces 82 of the solid structure 80, for example the front face 82A corresponds to the input layer edge 14A and the back face 82C corresponds to the output layer edge 14C. Thus, the fluid micro-channels 40 in the layers 10 each extend to an input layer edge 14A and to an output layer edge 14C so that fluid can flow through the fluid micro-channels 40.

The other layer edge 14B corresponds to the side face 82B and, in the alternative embodiment of FIG. 7, can have the conductor port 64. In the embodiment of FIG. 8, the fluid micro-channels 40 have the first fluid port 48A and the conductor micro-channel 60 includes the solid conductor 62A with the conductor port 64 both located on the input layer face 14A of the front side 82A of the solid structure 80 so that the fluid micro-channels 40 in the layers 10 extend to a face 82 and the solid conductors 62A extend to the same face 82, in this illustration front face 82A. In contrast, the illustration of FIG. 7 shows the fluid micro-channels 40 in the layers 10 extending to a different face 82 than the solid conductors 62A.

Figure 9A:
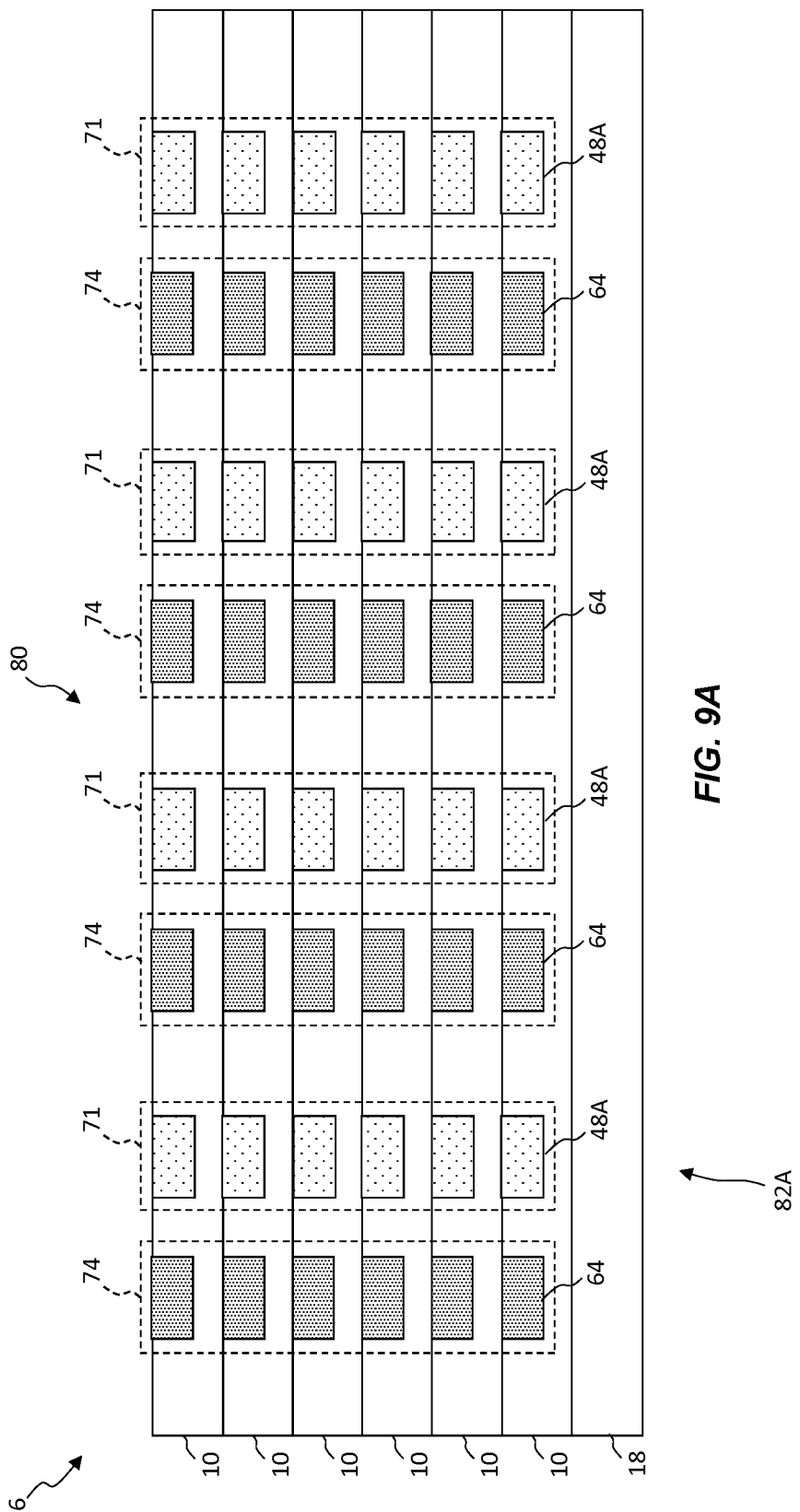
FIGS. 9A-9C are front, side, and back views of an embodiment of the present invention.
Figure 9B:
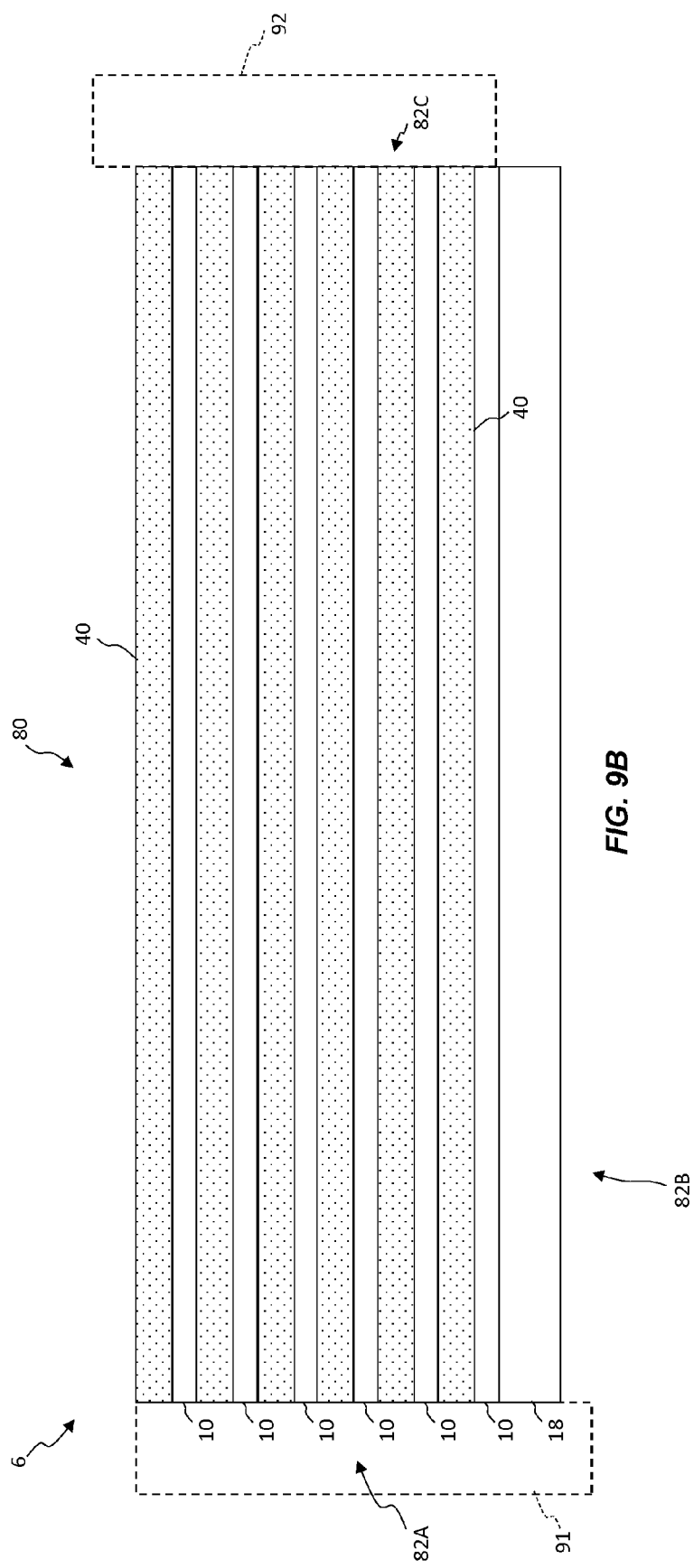
Figure 9C:
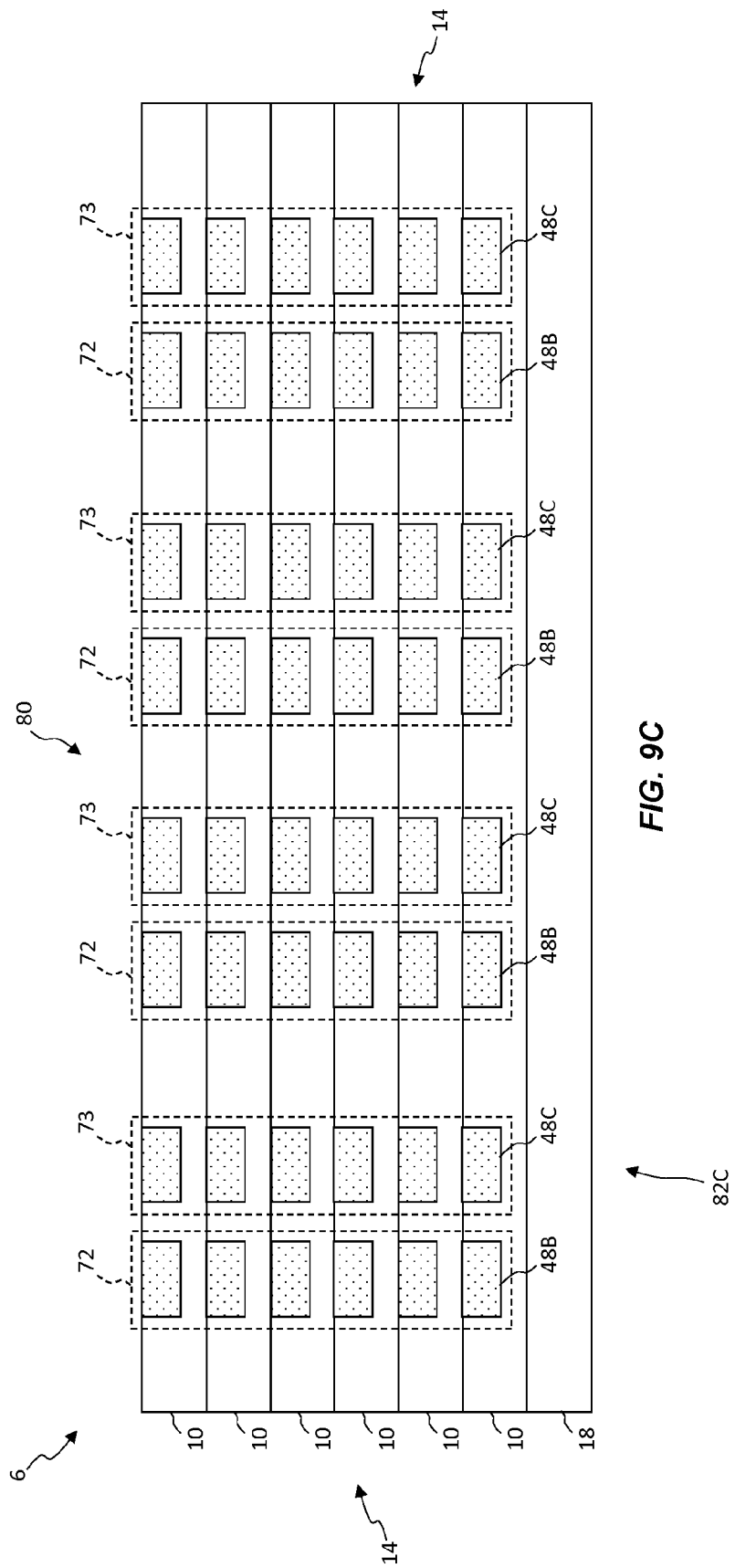

FIG. 9A illustrates a front view corresponding to the front face 82A, FIG. 9B illustrates a side view corresponding to the side face 82B, and FIG. 9C illustrates a back view corresponding to the back face 82C of the solid structure 80 shown in FIG. 8. As shown in FIG. 8 and FIGS. 9A, 9B, and 9C, the three-dimensional micro-channel structure 6 according to an embodiment of the present invention includes a plurality of layers 10 arranged in a stack forming the solid structure 80. Each layer 10 has one or more separate micro-channels, e.g. fluid micro-channels 40, each fluid micro-channel 40 having at least a first fluid port 48A, a second fluid port 48B, and a third fluid port 48C, the first fluid ports 48A spatially aligned in the stack so that the first fluid ports 48A form one or more contiguous first areas 71 that do not include a second or third fluid port 48B, 48C or conductor port 64 (FIG. 9A). Likewise, referring to FIG. 9C, the second fluid ports 48B are spatially aligned in the stack so that the second fluid ports 48B form one or more contiguous second areas 72 that do not include a first or third fluid port 48A, 48C or conductor port 64. As also shown in FIG. 9C, the third fluid ports 48C are spatially aligned in the stack so that the third fluid ports 48C form one or more contiguous third areas 73 that do not include a first or second fluid port 48A, 48B, or conductor port 64. Each of the contiguous first areas 71 includes at least one first fluid port 48A from each of two or more layers 10 in the stack, each of the contiguous second areas 72 includes at least one second fluid port 48B from each of two or more layers 10 in the stack, and each of the contiguous third areas 73 includes at least one third fluid port 48C from each of two or more layers 10 in the stack. FIG. 9A also illustrates a conductor contiguous area 74 that includes conductor ports 64 but not any of the first, second, or third ports 48A, 48B, or 48C from each of two or more layers 10 in the stack.

Figure 10A:
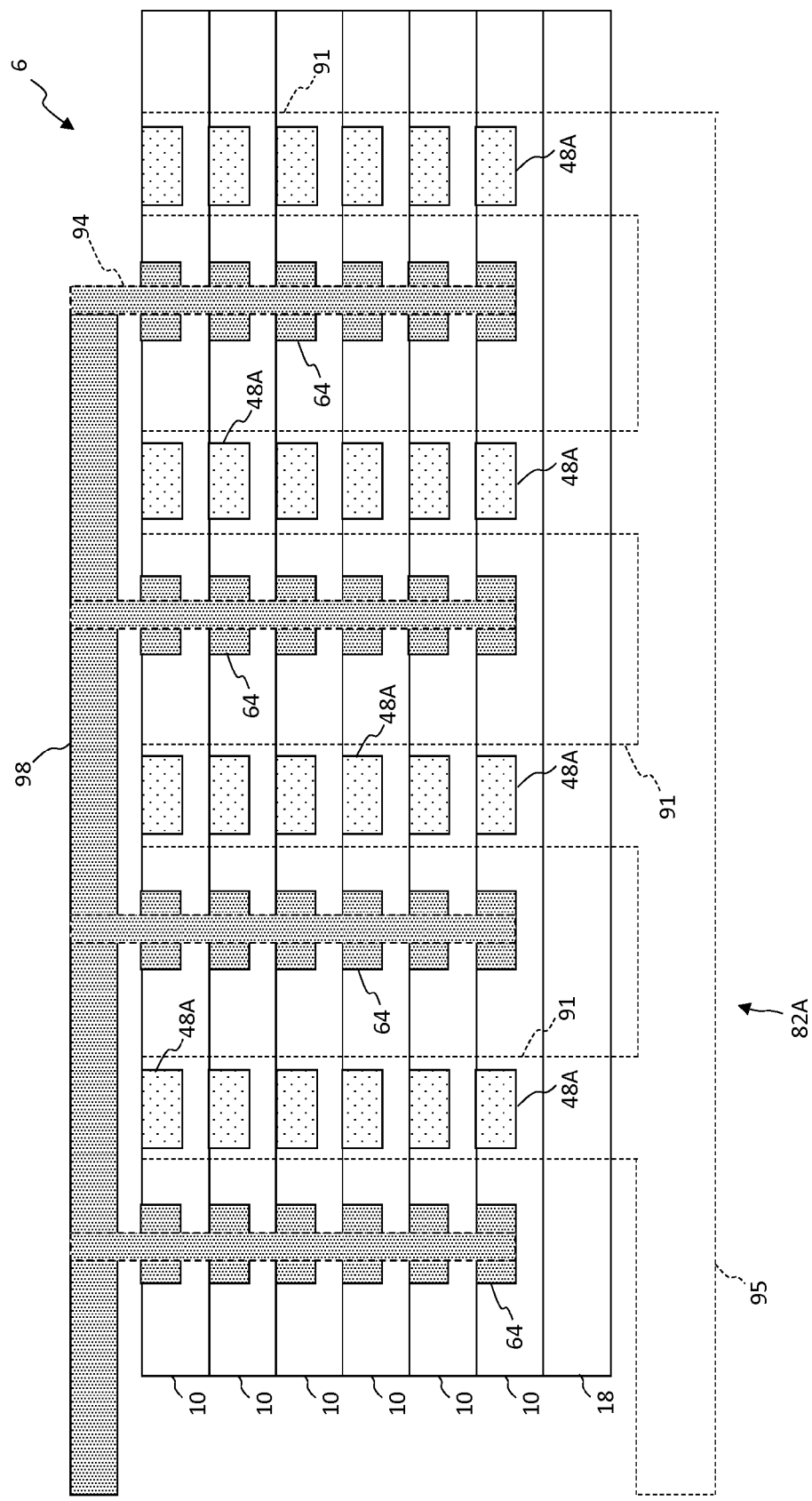
FIGS. 10A-10B are front and back views of an embodiment of the present invention.
Figure 10B:
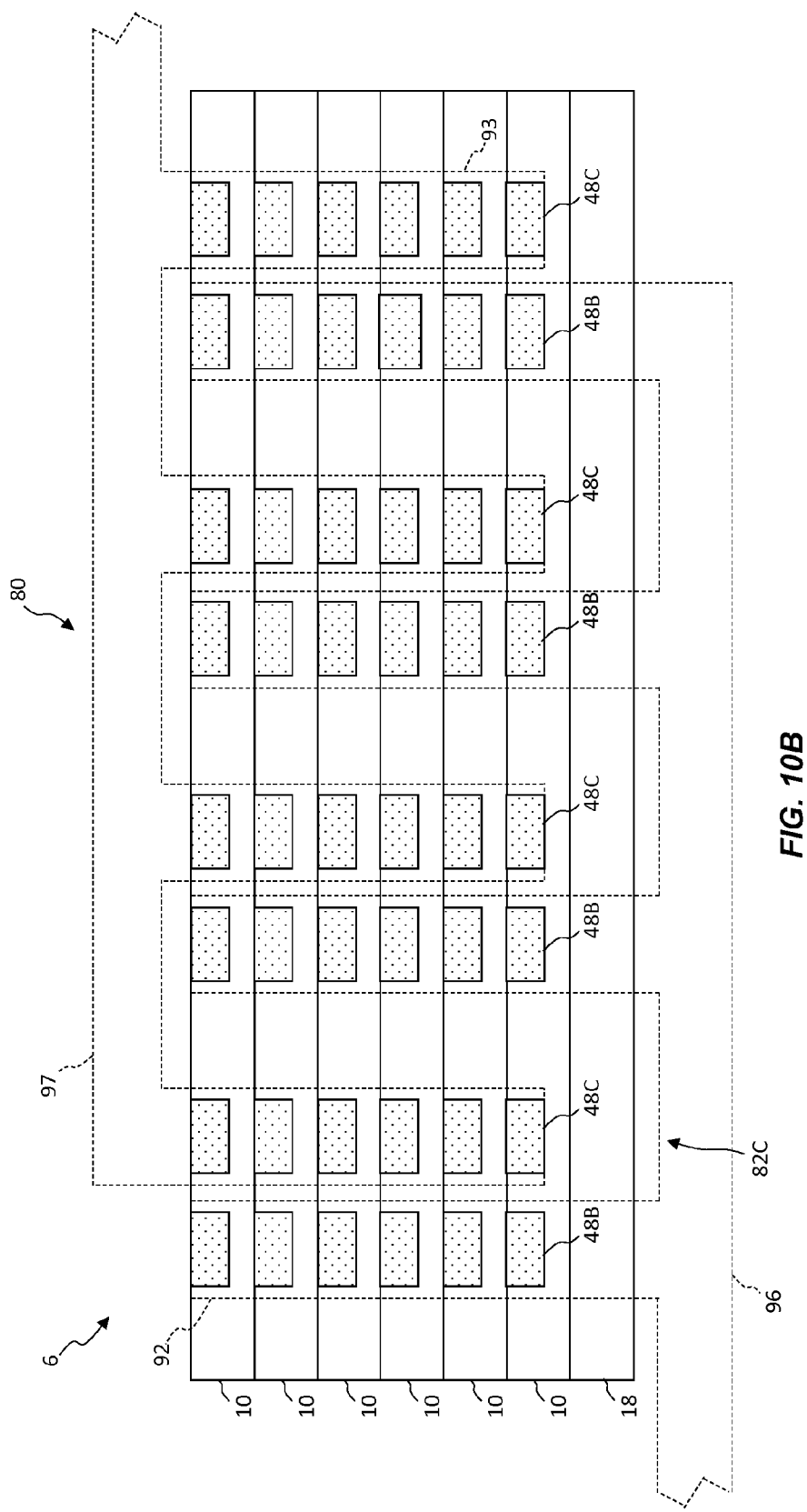

As shown in FIG. 9B, the three-dimensional micro-channel structure 6 also includes one or more first pipes 91 on the front face 82A and one or more second pipes 92 on the back face 82C. Each first pipe 91 has an open side that covers only the contiguous first area 71 (FIG. 9A) and each second pipe 92 has an open side that covers only the contiguous second area 72 (FIG. 9C). Referring also to FIGS. 10A and 10B (which also illustrate the front and back faces 82A and 82C), the three-dimensional micro-channel structure 6 also includes one or more third pipes 93 (FIG. 10B), each third pipe 93 having an open side that covers only the contiguous third area 73 (FIG. 9C). Thus, the first pipe 91 can supply fluid to the fluid micro-channel 40 and the second pipe 92 (FIG. 9B) and third pipe 93 (FIG. 10B) expel fluid. In an application for water desalination, the first pipe 91 can supply salt water, the second pipe 92 can receive fresh water, and the third pipe 93 can receive brine (water with a greater concentration of salt than the input salt water).

Referring further to FIGS. 8-10B, in another embodiment, the three-dimensional micro-channel structure 6 includes a plurality of layers 10 arranged in a stack, each layer 10 having one or more fluid micro-channels 40, separate electrode micro-channels 20, and conductor micro-channels 60. Each fluid micro-channel 40 has at least a fluid port (e.g., first fluid port 48A), each electrode micro-channel 20 has an electrode 30, and each conductor micro-channel 60 has an electrical conductor (e.g., solid conductor 62A or liquid conductor 62B) electrically connected to the electrode 30 and the conductor port 64.

The fluid ports (e.g., first, second, and third fluid ports 48A, 48B, 48C) are spatially aligned in the stack so that the fluid ports form one or more contiguous fluid areas (e.g., first contiguous area 71) that do not include the conductor port 64. The conductor ports 64 are spatially aligned in the stack so that the conductor ports 64 form one or more conductor contiguous areas 74 that do not include a fluid port (e.g., first, second, or third fluid ports 48A, 48B, 48C). Each of the contiguous fluid areas (e.g., first contiguous area 71) includes at least one fluid port from each of two or more layers 10 in the stack and each of the contiguous conductor areas 74 includes at least one conductor port 64 from each of two or more layers 10 in the stack. Referring specifically to FIGS. 9A and 10A, the three-dimensional micro-channel structure 6 also includes one or more fluid pipes (e.g. first pipe 91), each fluid pipe having an open side that covers only a contiguous fluid area (e.g., first contiguous area 71), and one or more conductor pipes 94, each conductor pipe 94 having an open side that covers only a contiguous conductor area 74.

FIGS. 10A and 10B, corresponding to a view of the front face 82A and the back face 82C of the solid structure 80, respectively, illustrate connections to the three-dimensional micro-channel structure 6 of an embodiment of the present invention. As shown in FIG. 10A, a plurality of layers 10 are formed on the support 18. Each layer 10 includes one or more conductor ports 64 and first fluid ports 48A on the front face 82A (FIG. 10A) and one or more second fluid ports 48B and third fluid ports 48C (FIG. 10B). As shown in FIG. 10A, the first pipes 91 cover a contiguous group of the first fluid ports 48A. The first pipes 91 are each connected to a common first container 95 providing a common supply of fluid to the first fluid ports 48A. Conductor pipes 94 cover a contiguous collection of conductor ports 64 that are each connected to a common electrical bus 98 providing a common power supply to the conductor ports 64 and the electrodes 30 (FIG. 1A). In this embodiment, the conductor pipes 60 are essentially wires; in an alternative embodiment they are pipes similar to the first pipes 91 that convey an electrically conductive liquid such as fluid conductor 62B into the conductor micro-channels 60. If the conductor ports 64 are on a different face of the solid structure 80 (e.g., as shown in FIG. 7), all of the first fluid ports 48A can be part of the common first contiguous area 71 that is covered by a single first pipe 91 connected to the first container 95.

Referring to FIG. 10B, the second pipes 92 cover a contiguous collection of the second fluid ports 48B. The second pipes 92 are each connected to a common second container 96 providing a common reservoir of fluid received from the second fluid ports 48B. Similarly, the third pipes 93 cover a contiguous collection of the third fluid ports 48C. The third pipes 93 are each connected to a common third container 97 providing a common reservoir of fluid received from the third fluid ports 48C. Thus, the stack of layers 10 forms the solid structure 80 with at least front and back faces 82A, 82C. The first fluid ports 48A are on the front face 82A and the second and third fluid ports 82B, 82C are on the back face 82C.

In one embodiment of the present invention and as shown in FIGS. 9C and 10B, the contiguous second and third areas 72, 73 form a series of spatially alternating areas. In another embodiment, one of the first, second, or third contiguous areas 71, 72, 73 forms a rectangular area. In other embodiments, all of the first pipes 91 are connected to the common first container 95, all of the second pipes 92 are connected to the common second container 96, or all of the third pipes 93 are connected to the common third container 97. In a useful embodiment shown in FIG. 10B, a stack of layers 10 forms the solid structure 80 with at least first and second faces (e.g. the front face 82A in FIG. 9A and the back face 82C in FIG. 9C), each face having a top side and a bottom side and the second container 96 is located adjacent to the bottom side and the third container 97 is located adjacent to the top side or vice versa.

Figure 12:
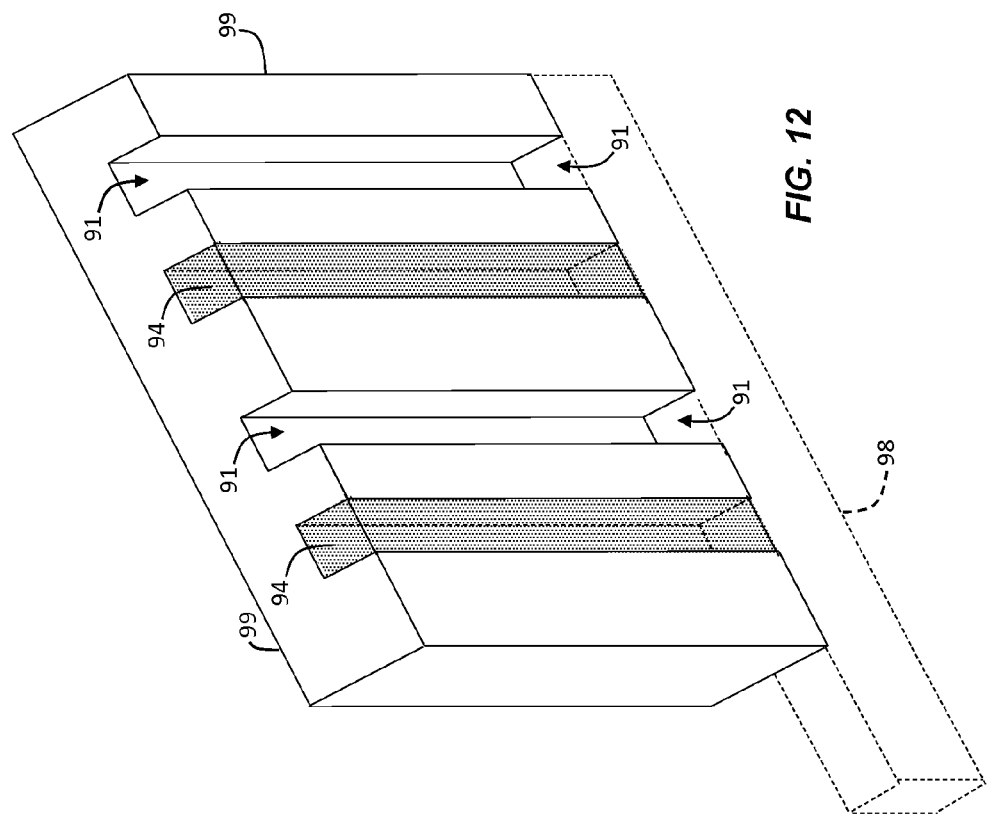
FIGS. 11 and 12 are perspectives of a structure useful in an embodiment of the present invention.
Figure 11:
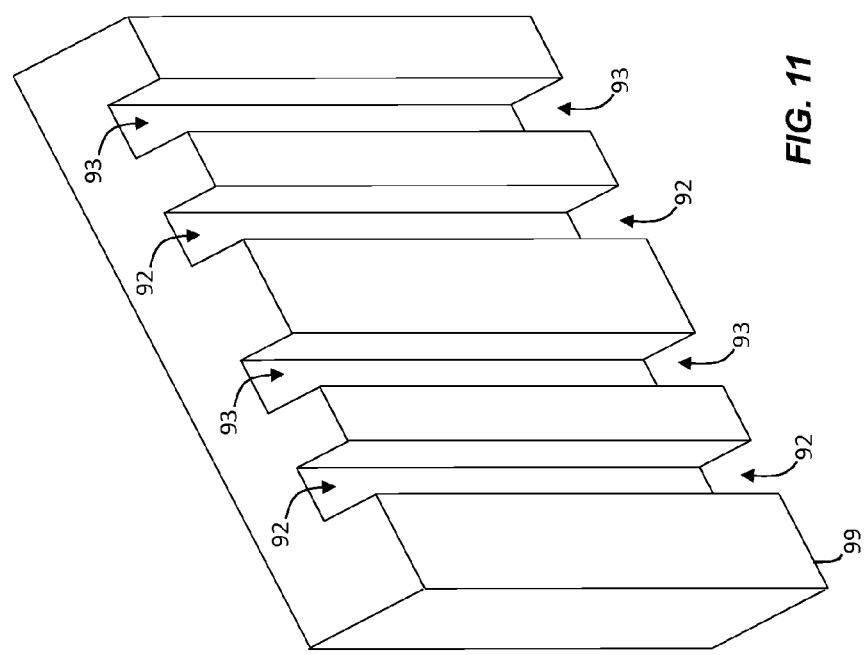

Referring next to FIGS. 11 and 12, in an embodiment one or more of the first, second, or third pipes 91, 92, 93 or conductor pipes 94 are channels imprinted in a pipe substrate 99. As shown in FIG. 11, each channel can form a pipe in the pipe substrate 99 so that the pipe substrate 99 includes one or more second pipes 92 and one or more third pipes 93. The second and third pipes 92, 93 are spaced apart so that they will align with the second and third contiguous areas 72, 73 on the back face 82C of the solid structure 80 (FIG. 10B). Similarly, as shown in FIG. 12, each channel can form a pipe in the pipe substrate 99 so that the pipe substrate 99 includes one or more first pipes 91 and one or more conductor pipes 94. As noted above, the conductor pipes 94 essentially contain or are wires; in the embodiment of FIG. 12 the wires are located in the channel forming the conductor pipe 94. The first pipe 91 and conductor pipe 94 are spaced apart so that they will align with the first contiguous area 71 and the conductor contiguous area 74 on the front face 82A of the solid structure 80 (FIG. 10A). The wire in each conductor pipe 94 forms an electrical connection to the electrical conductors in the corresponding contiguous connection area 74 through the conductor ports 64 (FIG. 10A).

In an embodiment, separate pipe substrates 99 are aligned with the front face 82A and the back face 82C and also to the side face 82B in the case illustrated in FIG. 7. Thus, the three-dimensional micro-channel structure 6 can include multiple pipe substrates 99.

In operation, an electrically conductive liquid such as an electrolyte flows under pressure through the fluid micro-channels 40. In one embodiment, the conductor micro-channel 60 includes the liquid conductor 62B that can be the same electrically conductive liquid but electrically separated. In another embodiment, the conductor micro-channel 60 includes the solid conductor 62A that can be the same conductive solid as the conductor that makes up the electrode 30. The electrical power source 16 provides a voltage differential between the solid conductor 62A or the liquid conductor 62B in the conductor micro-channel 60 and the fluid flowing through the fluid micro-channel 40.

As the fluid flows past the charged electrode 30 in the micro-channel intersection, an electrochemical reaction occurs, for example exerting a force on ions in the electrolyte that pushes the ions toward the micro-channel branch (e.g., the third fluid micro-channel portion 40C in FIG. 1A). In the case of a water desalination application, the salt water moves toward the third fluid port 48C making a brine micro-channel and the fresh water continues flowing to the second fluid micro-channel portion 40B making a fresh-water micro-channel. The separated water then flows into separate pipes (e.g., second pipe 92 and third pipe 93) and the fresh water is used. Multiple electrochemical processes can be applied to both the fresh water stream and the brine stream, for example as shown in FIG. 6.

FIGS. 21A and 21B show different embodiments of the electrode 30 and fluid micro-channel 40 structure formed in the layer 10 on support 18 in more detail. As shown in FIGS. 21A and 21B, the electrode 30 is formed on the layer bottom 12 for example by photo-lithographic processes. In this embodiment, there is not necessarily any electrode micro-channel 20. The fluid micro-channel 40 is located at least partially on the electrode 30 so that the fluid micro-channel bottom 42 is in contact with the top surface of the electrode 30. In FIG. 21B, the fluid micro-channel bottom 42 also rests partly on the layer bottom 12 so that the electrode 30 occupies a portion of the fluid micro-channel bottom 42.

The structures of FIGS. 21A and 21B locate electrical charge for an electrochemical reaction as shown in FIG. 22A. In FIG. 22A, the electrode 30 formed in layer 10 on support 18 is charged (indicated with '+' signs) adjacent to the fluid micro-channel bottom 42. The arrows in the Figure illustrate the force exerted on an ionic conductive fluid flowing through the fluid micro-channel 40. The largest and most extensive force directs the fluid upward since, in this embodiment the electrode 30 is typically wider than it is thick (W is much greater than D as shown in FIGS. 1A and 1B) so that most of the charge is on the top surface of the electrode 30.

In contrast the structure illustrated in FIG. 1B and in FIG. 22B includes the electrode 30 that extends from the electrode micro-channel bottom 22 toward the electrode micro-channel top 24, for example more than 50%, 80%, 90%, 95%, or substantially all of the way from the fluid micro-channel bottom 42 to the fluid micro-channel top 44. In this arrangement, the charge is located along the vertical electrode edge 33 of the electrode 30 so that the only net force exerted on the ionic conductive fluid flowing through the fluid micro-channel 40 is horizontal and in the direction of the third fluid micro-channel portion 40C (FIGS. 1A and 1B). Therefore, the arrangement of FIGS. 1A, 1B, and 22B is more efficient at moving the ionic fluid and separating, in the example of water desalination, the brine from the fresh water.

Furthermore, the arrangement of FIGS. 1A, 1B, and 22B scale to larger fluid flows more readily than the arrangements of FIGS. 21A and 21B. In the structure of FIGS. 21A and 21B, as the fluid micro-channel 40 grows deeper to accommodate an increased fluid flow, because of the increased distance between the charge and the fluid at the fluid micro-channel top 44, the force exerted on the fluid at the fluid micro-channel top 44 decreases, reducing effectiveness. Furthermore, as noted above a wider channel that accommodates an increased fluid flow exerts force primarily vertically, also reducing effectiveness. In contrast, the structure of FIGS. 1A, 1B, and 22B scales to deeper fluid micro-channel depths D to accommodate increased fluid flow through the fluid micro-channel 40 without reducing effectiveness. Since the charge is distributed along the vertical electrode edge 33, charge forces interact with the ionic conductive liquid at a constant distance along the entire vertical electrode edge 33, regardless of the micro-channel depth, as long as the fluid micro-channel 40 and the electrode 30 have a substantially common bottom (the fluid micro-channel bottom 42 and electrode micro-channel bottom 22) and the electrode 30 extends substantially to the fluid micro-channel top 44.

Figure 13B:
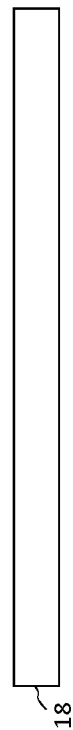
FIGS. 13A-13B are perspective and cross section views of a support structure according to an embodiment of the present invention.
Figure 13A:
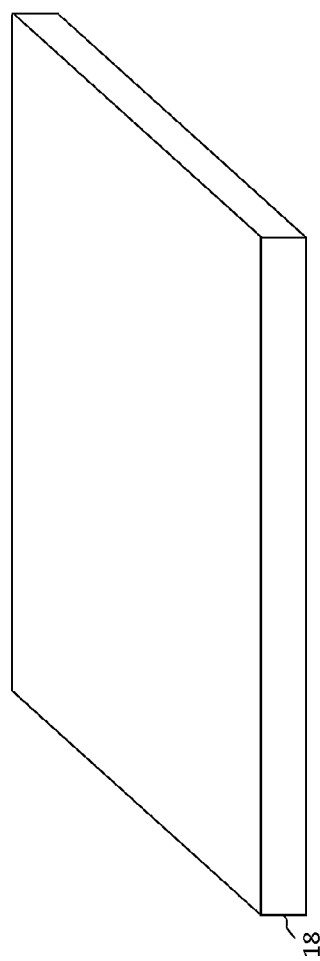
Figure 23:
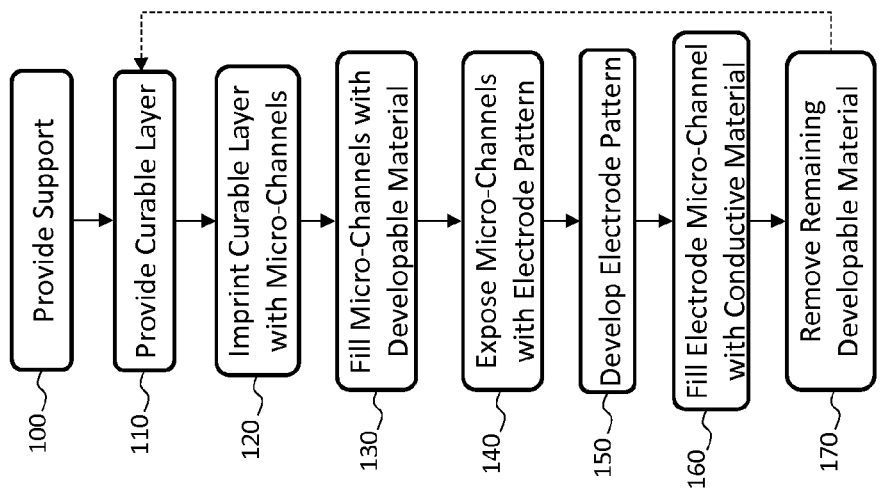

Referring to the method described in the FIG. 23 flow chart and the illustrations of sequential construction steps in FIGS. 13-20, a method of making the micro-channel electrode structure 5 includes providing the support 18 in step 100 as shown in the perspective of FIG. 13A and the cross section of FIG. 13B. The support 18 can include a substrate, for example glass or plastic on which subsequent layers are formed. Such substrates providing the support 18 are commercially available. The curable layer 10 is provided on the support 18 in step 110 as shown in the perspective of FIG. 14A and the cross section of FIG. 14B. Suitable curable layers 10 can include polymers and resins with cross-linking material and are known in the art. In an embodiment, the curable layer 10 is coated, for example by spray, hopper, or curtain coating; in another embodiment a freestanding curable layer 10 is laminated to the support 18. Suitable coating or laminating methods and tools are available. An optional soft-bake step can be performed to provide additional layer robustness for the following steps.

The curable layer 10 is imprinted in step 120 to form the electrode micro-channel 20 and a fluid micro-channel 40 in a common step. The conductor micro-channel 60 can also be imprinted in the same common step. The electrode micro-channel 20 intersects the fluid micro-channel 40 to form the micro-channel intersection 50. The curable layer 10 is cured to form an imprinted cured layer 10. The layer, curable layer, and cured layer 10 are designated with a common part number since they are the same layer in different states at different times. The FIG. 15A perspective and cross section FIG. 15B illustrate the support 18 and cured layer 10 having the imprinted conductor micro-channel 60, the electrode micro-channel 20, the fluid micro-channel 40 and the other fluid micro-channel 41 and the other conductor micro-channel 61. (The cross section FIG. 15B is taken across cross section line B of FIG. 15A as are the cross sections for FIGS. 13B-20B.)

Figure 15D:
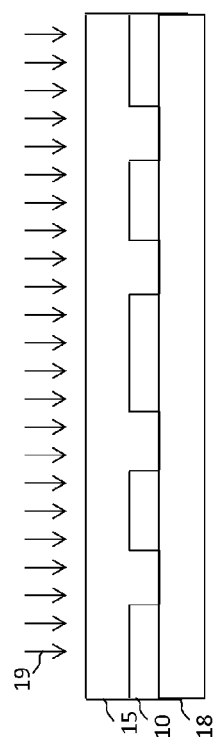
FIGS. 15C-15E show sequential steps useful for imprinting the micro-channel according to the embodiment shown in FIGS. 15A-15B.
Figure 15E:
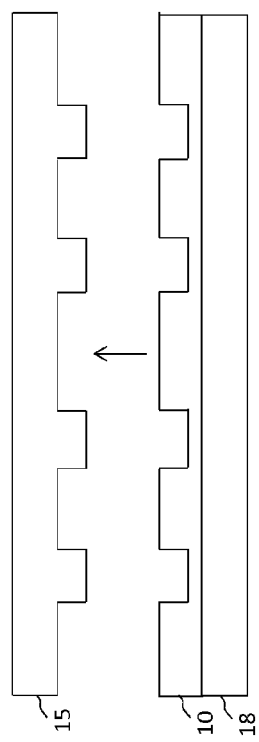
Figure 15C:
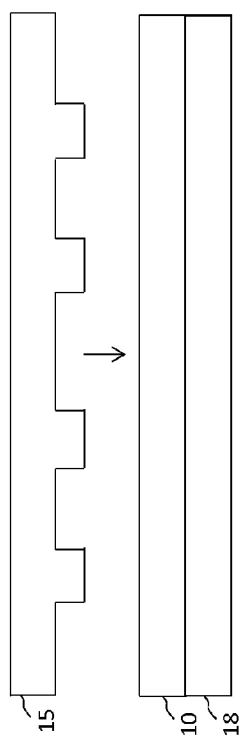

FIGS. 15C-15E illustrate in more detail one method useful for the present invention. Once the curable layer 10 is provided on support 18, for example by laminating or coating, the stamp 15 having a reverse pattern of the desired electrode, fluid, and conductor micro-channels 20, 40, 60 is provided in alignment with the support 18 and curable layer 10 (FIG. 15C) and then mechanically impressed into the curable layer 10 to form the desired fluid, conductor, and electrode micro-channels 40, 60, 20. The curable layer 10 is then cured, for example with heat or electromagnetic radiation 19 such as ultraviolet light to cross link a polymer or resin material, to form the cured layer 10 having the desired fluid, conductor, and electrode micro-channels 40, 60, 20 (FIG. 15D). The stamp 15 is then removed from the cured layer 10 and support 18 (FIG. 15E). Suitable stamps, for example made of PDMS and photolithographically structured, are known in the art as are imprinting processes.

Figure 16B:
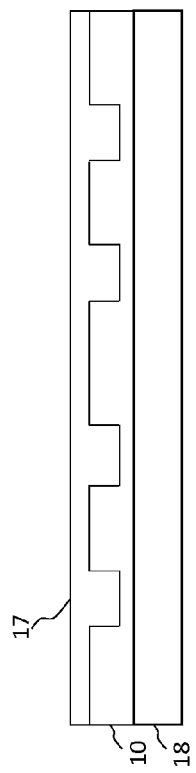
FIGS. 16A-16B are perspective and cross section views of the structure of FIGS. 15A-15B with a developable material applied thereon according to an embodiment of the present invention.
Figure 16A:
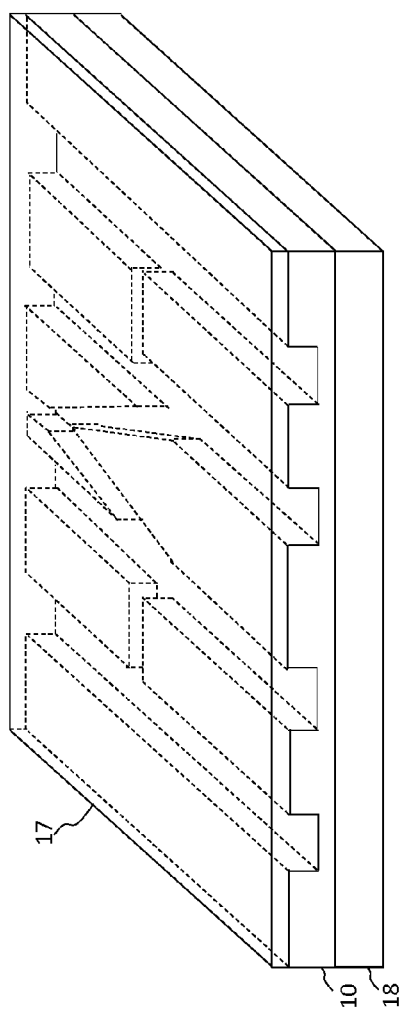

Referring to FIGS. 16A and 16B, the fluid, conductor, and electrode micro-channels 40, 60, 20 in the cured layer 10 on the support 18 are then at least partially filled with a developable material 17, for example a photoresist, in step 130. Suitable photoresists, such as Micropos 1813, are available. The developable material 17 can be applied by known coating methods. The developable material 17 can also extend over the surface of the cured layer 10.

Figure 17A:
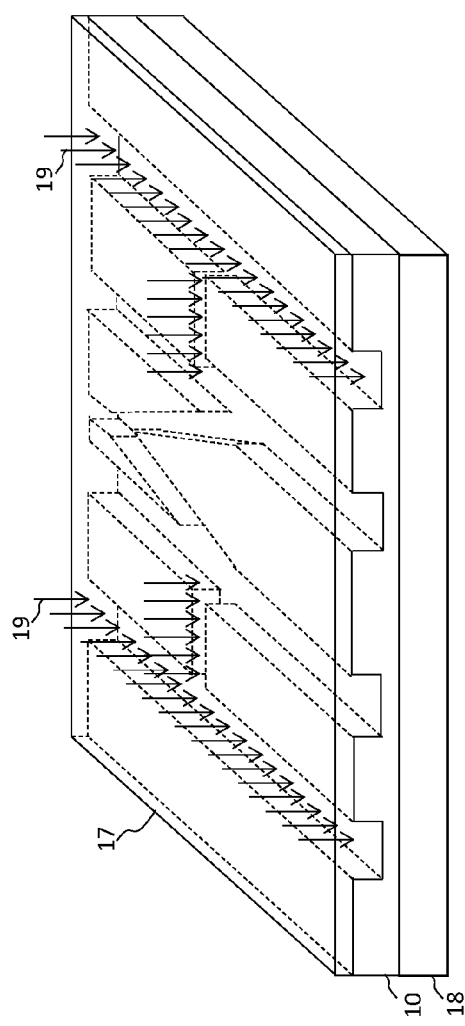
FIGS. 17A-17B are perspective and cross section views of the structure of FIGS. 16A-16B exposed to radiation to develop the developable material according to an embodiment of the present invention.
Figure 17B:
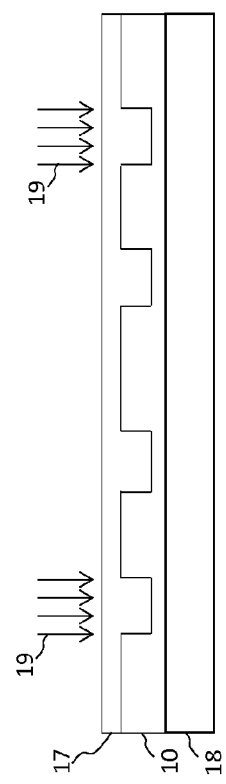

The developable material 17 on the cured layer 10 and the support 18 is exposed with an electrode pattern in step 140, for example with electromagnetic radiation 19 such as ultraviolet light and as shown in FIGS. 17A and 17B. The electrode pattern includes the electrode micro-channel 20 and extends from the electrode micro-channel 20 into the micro-channel intersection 50 (FIG. 1A) without occluding the fluid micro-channel 40. In an embodiment, the electrode pattern also includes the conductor micro-channel 60, as shown in FIGS. 17A and 17B, and corresponds to the structure using a solid conductor 62A (FIG. 2). In an alternative embodiment the electrode pattern does not include the conductor micro-channel and a liquid conductor 62B is used (FIG. 4). The micro-channel structures in the cured layer 10 are indicated with dashed lines in FIG. 17A. In an embodiment, the electrode pattern includes all of the locations in which a solid conductor (e.g. the solid conductor 62A and the electrode 30, FIG. 1A, 2) is desired.

Figure 18A:
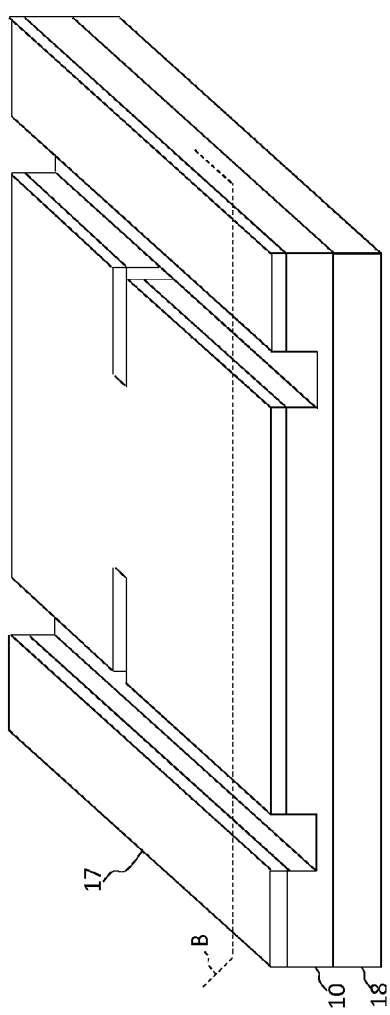
FIGS. 18A-18B are perspective and cross section views of the structure of FIGS. 17A-17B after the developed material has been removed according to an embodiment of the present invention.
Figure 18B:
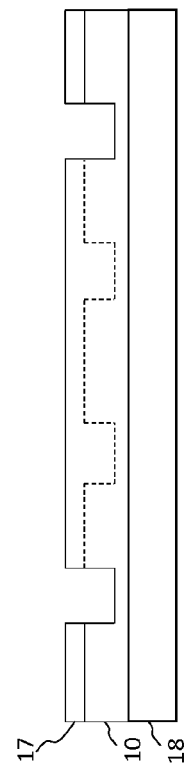

In step 150, the exposed developable material 17 is developed to remove the developable material 17 from the electrode pattern, for example by washing or rinsing with a liquid such as water, aqueous liquids, or solvents, as is shown in FIGS. 18A and 18B where the electrode pattern is illustrated in the developable material 17 and the cured layer 10 on the support 18. Micro-channel structures that are not part of the cured layer 10 are indicated with dashed lines in FIG. 18B. The developable material 17 is not removed from the areas that are not within the electrode pattern. Either a positive or negative-acting developable material 17 can be used or the electrode pattern can include either a positive or negative pattern, as is well known. Useful coating, exposure, and developing methods are well known in the photolithographic arts.

Figure 19B:
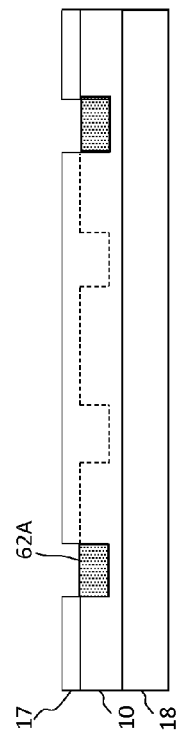
FIGS. 19A-19B are perspective and cross section views of the structure of FIGS. 18A-18B with a conductive material applied thereon according to an embodiment of the present invention.
Figure 19A:
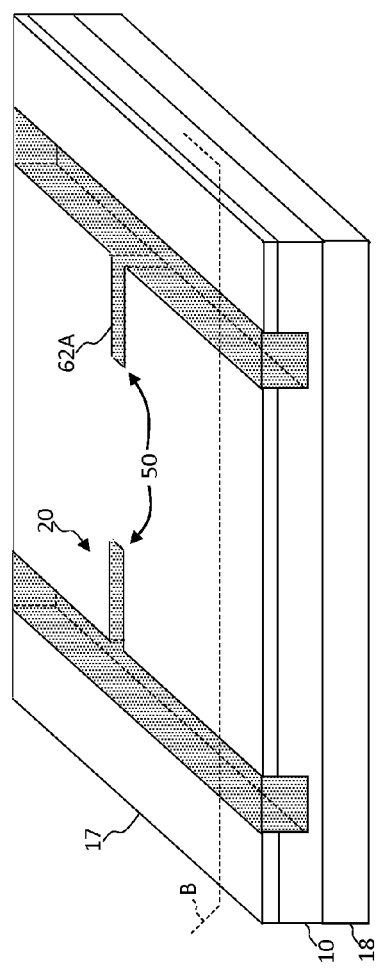

Referring next to FIGS. 19A and 19B, the micro-channels in the developable material 17 and the cured layer 10 on the support 18 corresponding to the electrode pattern, and at least including the electrode micro-channel 20 and a portion of the micro-channel intersection 50 but not occluding the fluid micro-channels 40 (FIG. 1A), are at least partially filled with a conductive material, for example the solid conductor 62A, in step 160. In one embodiment, the cross sections of FIGS. 19C-19E illustrate this step 160 further. As shown in FIG. 19C, a curable conductive ink 13 is coated using known methods of the surface of the developable material 17 on the cured layer 10 on the support 18 and into the micro-channels of the electrode pattern. In an embodiment, the curable conductive ink 13 on the surface of the developable material 17 is removed, for example by wiping. In an alternative embodiment it is not removed or is removed in a later step. As shown in FIG. 19D, the curable conductive ink 13 on the cured layer 10 and the support 18 is cured, for example by heat or exposure to a vapor 66, such as HCl vapor, to form the solid conductor 62A in the electrode pattern micro-channels shown in FIG. 19E. In an embodiment, the curing step does not interfere with the remaining developable material 17 coated on the cured layer 10. Curable conductive inks 13 are known and can include metallic particles, such as silver, copper, palladium, carbon, or other metals individually or in combination. Any material that is electrically conductive and enables the desired electrochemical reaction can be used. The curable conductive ink 13 is a precursor to the cured solid conductor 82A and need not be conductive before curing. Once the precursor material (e.g., the liquid conductive ink) is cured, the precursor material is converted to the conductive material.

In step 170, at least a portion of the remaining developable material 17 is removed from the fluid micro-channel 40 to provide the micro-channel structures shown in FIGS. 20A and 20B. Removing the remaining developable material 17 can include exposing at least part of the remaining developable material 17 and developing the exposed remaining developable material 17 or removing the remaining developable material 17 by washing or rinsing with an aqueous or non-aqueous liquid or solvent. As shown in FIGS. 20A and 20B, the solid conductor 62A is provided in the micro-channels of the electrode pattern, including in this case the conductor micro-channel 60 and the electrode micro-channel 20 including a portion of the micro-channel intersection 50. Thus, the solid conductor 62A forms both the electrode 30 and the electrical conductor electrically connected to the electrode 30.

Figure 20C:
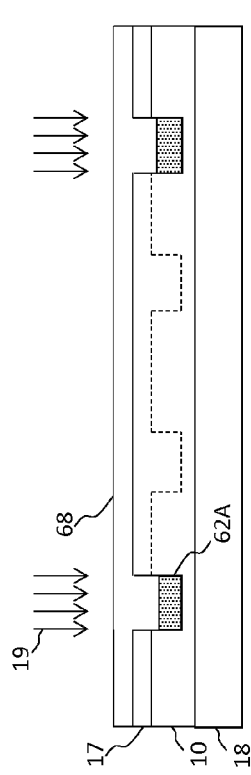
FIGS. 20C-F show sequential steps useful for protecting a solid during the formation of micro-channel structures according to an embodiment of the present invention.
Figure 20D:
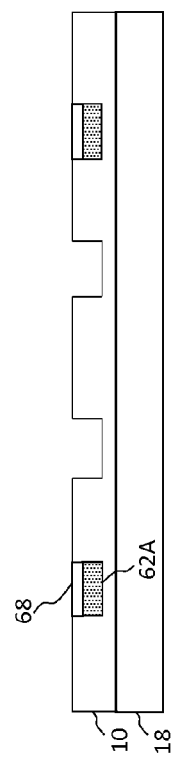
Figure 20E:
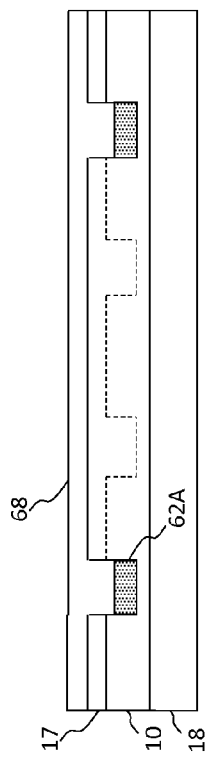
Figure 20F:
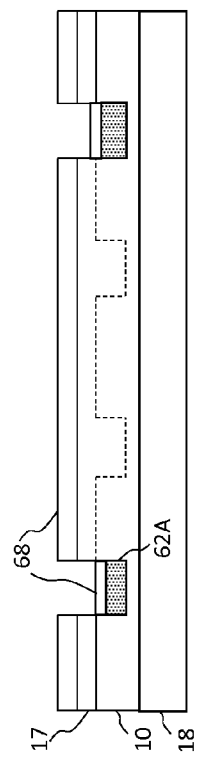
Figure 25:
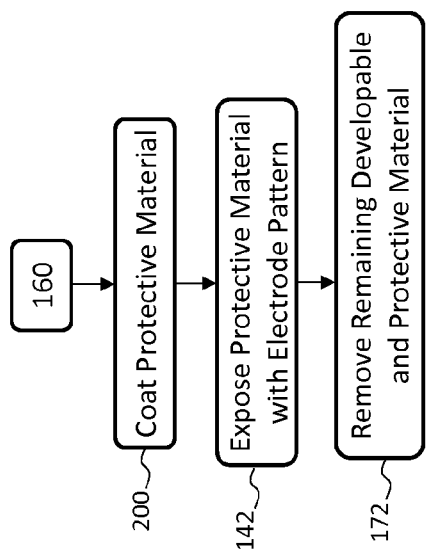
FIGS. 23-25 are flow charts useful in understanding various method of the present invention.

In an additional embodiment illustrated in FIGS. 20C-20F, the solid conductor 62A is protected from the process of removing the remaining developable material 17. As shown in FIGS. 20C-20F and in FIG. 25, the developable material 17 is on the surface of the layer 10 on the support 18 but not in the micro-channels of the electrode pattern or on the solid conductor 62A after step 160. A protective layer 68, for example including a curable resin similar to or the same as that of the layer 10, is coated or laminated over the developable material 17 and the solid conductor 62A in the micro-channels of the electrode pattern (FIG. 20C) in step 200. The protective layer 68 is exposed using the same or a similar electrode pattern in step 142, for example with electromagnetic radiation 19 to cure the protective layer 68 in the electrode pattern (FIG. 20D) and thereby provide a cured protective material 68 over the solid conductor 62A (FIG. 20E). The uncured protective layer 68 and remaining developable material 17 are then removed in step 172, for example by rinsing, washing, or exposure to aqueous or non-aqueous solvents. Removal of undeveloped developable material 17 (e.g., photoresist) or uncured resins (e.g. SU8) is very well known and practiced in the photolithographic arts. In an embodiment, a cover or cover layer is located, adhered, or laminated to the layer 10.

The Figures are not to scale and, in particular, the thicknesses of the developable material 17 and the protective layer 68 are very small relative to the support or layer 10 thicknesses. In consequence, the portions of the developable material 17 and the protective layer 68 that are on the layer 10 but not in the micro-channels are not consequential and are simply not shown in FIG. 20F. The thickness of the solid conductor 62A is not critical nor is it critical if the solid conductor 62A with or without the protective layer 68 extends above or below the surface of the layer 10. Furthermore, if the solid conductor 62A is also used to fill only a portion of the fluid micro-channels 40 to improve the electrical conductivity of the electrical circuit, a reduced amount of conductive ink can be supplied in the fluid micro-channels 40 by reducing inkjet deposition if that deposition method is used, by a photolithographic method, or by imprinting fluid micro-channels 40 that are wider than the electrode or conductor micro-channels 20, 60 so that they do not fill as completely and reduce in height more during the curing process. Such methods and materials are known in the art.

In an embodiment, the first, second, third, and conductor pipes 91, 92, 93, 94 are made using an imprinting process. The solid conductor 62A in the conductor pipes is located using inkjet deposition, screen printing, or photolithographic methods. Alternatively, the conductor ports 64 on the input face 82A of the solid structure 80 are electrically connected with a wire bonded, formed, or deposited on the input face 82A, for example by screen or inkjet printing and curing the deposited material.

Figure 24:
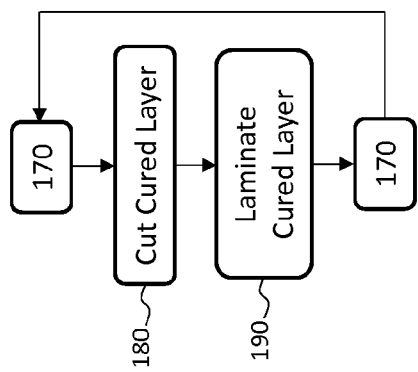

Methods of the present invention are applicable to roll-to-roll manufacturing and to forming a stack of layers 10. Referring to the flow chart of FIG. 24, after the layer 10 having the desired micro-channels and electrical conductors has been formed (step 170), one or more cured layers 10 is cut into pieces (step 180), each piece including one or more fluid micro-channels 40 and electrodes 30. The cut portions of the layers 10 are then stacked in alignment and adhered together, for example by laminating the layers (step 190) to make a multi-layer micro-fluidic micro-channel device. Release layers can be provided between the layer 10 and the support 18 to enable separation of the layer 10 from the support 18. Alternatively, the support 18 is included in the stack and forms an additional layer between each layer 10. In an embodiment, the micro-channels are aligned and laminated, for example with adhesive layers provided between the layers 10.

Alternatively, or in addition, additional layers 10 are formed, each layer 10 using the layer 10 below or a cover layer located on the layer 10 below as a support 18. In a useful embodiment of this case, an uncured layer 10 is laminated to an underlying layer 10 or other cover layer located or formed on layer 10 (step 110). The laminated uncured layer 10 or other cover layer has sufficient rigidity to maintain the fluid micro-channels 40 in the layer 10 beneath the uncured layer 10. The layer 10 is then processed as described in FIG. 23 steps 120-170. It is also useful to offset the micro-channels in the adjacent layers to provide additional support while still maintaining the first, second, third, and conductor contiguous areas 71, 72, 73, 74 (FIGS. 9A, 9C). Thus, multiple layers are formed into a stack providing a higher throughput structure for electrochemical processes. To further improve manufacturing efficiency, in an embodiment the steps 120-170 are done in common steps for all electrode, fluid, and conductor micro-channels 40, 50, 60 formed in the layer 10.

The present invention is useful in providing a structure and method of making a structure that enables electrochemical reactions between an electrolyte fluid flowing through the fluid micro-channels 40 and the electrode 30.

The invention has been described in detail with particular reference to certain embodiments thereof, but it will be understood that variations and modifications can be effected within the spirit and scope of the invention.

PARTS LIST

A cross-section line
B cross-section line
D depth
L length
O oblique angle
S distance
W width
5 micro-channel electrode structure
6 three-dimensional micro-channel structure
10 layer/curable layer/cured layer
12 layer bottom
13 curable conductive ink
14 layer edge
14A same/input layer edge
14B other/conductor layer edge
14C output layer edge
15 stamp
16 electrical power source
17 developable material
18 support
19 radiation
20 electrode micro-channel
22 electrode micro-channel bottom
24 electrode micro-channel top
26 electrode micro-channel side wall
30 electrode
32 horizontal electrode edge
33 vertical electrode edge
34 first electrode end
36 second electrode end
40 fluid micro-channel
40A first fluid micro-channel portion
40B second fluid micro-channel portion
40C third fluid micro-channel portion
41 other fluid micro-channel
42 fluid micro-channel bottom
44 fluid micro-channel top
46 fluid micro-channel wall
48A first fluid port
48B second fluid port
48C third fluid port
50 micro-channel intersection
51 other micro-channel intersection
60 conductor micro-channel
61 other conductor micro-channel
62A solid conductor
62B fluid conductor
64 conductor port
66 vapor
68 protective layer
71 first contiguous area
72 second contiguous area
73 third contiguous area
74 conductor contiguous area
80 solid structure
82 face 82A front face
82B side face
82C back face
91 first pipe
92 second pipe
93 third pipe
94 conductor pipe
95 first container
96 second container
97 third container
98 electrical bus
99 pipe substrate
100 provide support step
110 provide curable layer step
120 imprint curable layer with micro-channels step
130 fill micro-channels with developable material step
140 expose micro-channels with electrode pattern step
142 expose protective material with electrode pattern step
150 develop electrode pattern step
160 fill electrode micro-channel with conductive material step
170 remove remaining developable material step
172 remove remaining developable and protective material step
180 cut cured layer step
190 laminate cured layer step
200 coat protective material step

The invention claimed is:

1. A method of making a micro-channel electrode structure, comprising:
   a) providing a curable layer;
   b) imprinting the curable layer to form an electrode micro-channel and a fluid micro-channel in a common step, the electrode micro-channel intersecting the fluid micro-channel to form a micro-channel intersection, and curing the curable layer to form an imprinted cured layer;
   c) at least partially filling both the electrode micro-channel and the fluid micro-channel with a developable material;
   d) exposing the developable material with an electrode pattern, the electrode pattern including the electrode micro-channel and extending from the electrode micro-channel into the micro-channel intersection without occluding the fluid micro-channel;
   e) developing the exposed developable material to remove the developable material from the electrode pattern;
   f) at least partially filling the electrode micro-channel and the micro-channel intersection corresponding to the electrode pattern with a conductive material; and
   g) removing at least a portion of the remaining developable material from the fluid micro-channel.

2. The method of claim 1 further including providing the curable layer on a support.

3. The method of claim 1 further including laminating a cover layer over the layer.

4. The method of claim 1 further including providing a cover layer over the layer and providing another curable layer on the cover layer and repeating the steps b) through g) for the other curable layer.

5. The method of claim 1 further including imprinting the curable layer to form multiple electrode micro-channels and fluid micro-channels, each electrode micro-channel intersecting a separate one of the multiple fluid micro-channels to form multiple micro-channel intersections.

6. The method of claim 5 the steps c) through g) are done in a common step for each electrode and fluid micro-channel.

7. The method of claim 5 further including cutting the curable layer into at least first and second portions and laminating the second portion to the first portion to form a stack.

8. The method of claim 1 further including at least partially filling the electrode micro-channel and the micro-channel intersection corresponding to the electrode pattern with a precursor material and then converting the precursor material to the conductive material.

9. The method of claim 1 further including locating a protective material over the conductive material in the electrode micro-channel before removing the developable material from the fluid micro-channel.

10. The method of claim 9 wherein locating the protective material over the conductive material in the electrode micro-channel further includes coating the layer with a curable protective material, exposing the curable protective material with the electrode pattern to cure the curable material corresponding to the electrode pattern.

11. The method of claim 10 further including removing the uncured curable material after the curable material is cured in the electrode pattern.

12. The method of claim 1, wherein at least partially filling the electrode micro-channel and the micro-channel intersection corresponding to the electrode pattern with a conductive material further includes coating the layer with a liquid ink, removing the liquid ink from the layer but not from the electrode micro-channel or micro-channel intersection portion corresponding to the electrode pattern, and curing the liquid ink to form the conductive material.

13. The method of claim 1 wherein the curable layer includes cross-linkable material and wherein imprinting and curing the curable layer further includes stamping the curable material with a stamp having a reverse electrode and fluid micro-channel pattern and cross-linking the curable material to form the imprinted cured layer.

14. The method of claim 13 wherein curing the curable layer exposing the curable layer to heat, electromagnetic radiation or both.

15. The method of claim 1 wherein the curable material is a resin.

16. The method of claim 1 wherein the developable material is a photoresist.

17. The method of claim 1 wherein developing the developable material includes washing the layer.

18. The method of claim 1 wherein removing at least a portion of the remaining developable material from the fluid micro-channel includes exposing at least part of the remaining developable material and developing the exposed developable material.

* * * * *